United States Patent
Luechinger et al.

(10) Patent No.: US 8,651,354 B2
(45) Date of Patent: Feb. 18, 2014

(54) ULTRASONIC BONDING SYSTEMS INCLUDING WORKHOLDER AND RIBBON FEEDING SYSTEM

(75) Inventors: Christoph Benno Luechinger, Irvine, CA (US); Orlando Luis Valentin, Rancho Santa Margarita, CA (US)

(73) Assignee: Orthodyne Electronics Corporation, Irvine, CA (US)

( * ) Notice: Subject to any disclaimer, the term of this patent is extended or adjusted under 35 U.S.C. 154(b) by 0 days.

(21) Appl. No.: 13/809,020

(22) PCT Filed: Jul. 18, 2011

(86) PCT No.: PCT/US2011/044364
§ 371 (c)(1),
(2), (4) Date: Jan. 8, 2013

(87) PCT Pub. No.: WO2012/012335
PCT Pub. Date: Jan. 26, 2012

(65) Prior Publication Data
US 2013/0112735 A1    May 9, 2013

Related U.S. Application Data

(60) Provisional application No. 61/365,573, filed on Jul. 19, 2010, provisional application No. 61/368,077, filed on Jul. 27, 2010, provisional application No. 61/371,277, filed on Aug. 6, 2010.

(51) Int. Cl.
*B23K 3/00* (2006.01)
*B23K 37/04* (2006.01)
*B23K 20/10* (2006.01)

(52) U.S. Cl.
USPC ....... 228/1.1; 228/110.1; 228/47.1; 228/49.5; 269/296; 269/303; 156/73.1; 156/580.1

(58) Field of Classification Search
CPC ......... B23K 3/00; B23K 37/04; B23K 20/126
USPC ............. 228/1.1, 110.1, 47.1, 49.5; 156/73.1, 156/580.1; 269/296, 303
See application file for complete search history.

(56) References Cited

U.S. PATENT DOCUMENTS 5,198,056 A * 3/1993 Stockli et al. ................ 156/73.1
5,894,983 A    4/1999 Beck et al.

(Continued)

FOREIGN PATENT DOCUMENTS

WO    WO03/012883 A2    2/2003

OTHER PUBLICATIONS

International Search Report with a mailing date of Feb. 24, 2012; International Patent Application No. PCT/US2011/044364.

*Primary Examiner* — Devang R Patel
(74) *Attorney, Agent, or Firm* — Christopher M. Spletzer, Sr.

(57) ABSTRACT

An ultrasonic ribbon bonding system is provided. The ultrasonic ribbon bonding system includes a workholder for supporting a workpiece during a ribbon bonding operation. The workholder defines a first plurality of standoffs extending above a surface of the workholder, the first plurality of standoffs configured to contact the workpiece during the ribbon bonding operation. The ultrasonic ribbon bonding system also includes a bond head assembly carrying a ribbon bonding tool, the ribbon bonding tool being configured to bond a ribbon to the workpiece during the ribbon bonding operation.

55 Claims, 31 Drawing Sheets

(56) References Cited

U.S. PATENT DOCUMENTS

| | | | |
|---|---|---|---|
| 6,269,999 B1 | 8/2001 | Okazaki et al. | |
| 7,828,031 B2 * | 11/2010 | Micciche | 156/517 |
| 2004/0219801 A1 | 11/2004 | Oswald et al. | |
| 2006/0278682 A1 | 12/2006 | Lange et al. | |
| 2007/0141755 A1 * | 6/2007 | Luechinger | 438/123 |
| 2011/0212572 A1 * | 9/2011 | Byars et al. | 438/106 |
| 2013/0019458 A1 * | 1/2013 | Byars et al. | 29/559 |
| 2013/0042960 A1 * | 2/2013 | Luechinger et al. | 156/73.1 |

* cited by examiner

ULTRASONIC BONDING SYSTEMS INCLUDING WORKHOLDER AND RIBBON FEEDING SYSTEM

CROSS-REFERENCE TO RELATED APPLICATIONS

This application claims the benefit of International Application No. PCT/US2011/044364 filed Jul. 18, 2011, which claims the benefit of U.S. Provisional Application Nos. 61/365,573 filed on Jul. 19, 2010; 61/368,077 filed on Jul. 27, 2010; and 61/371,277 filed on Aug. 6, 2010, the contents of each of which is incorporated herein by reference.

FIELD OF THE INVENTION

The present invention relates to ultrasonic bonding systems, and more particularly, to ribbon bonding systems including workholders and ribbon feeding systems for solar substrates and other workpieces.

BACKGROUND OF THE INVENTION

In the processing and packaging of semiconductor devices, ultrasonic bonding (e.g., wire bonding, ribbon bonding, etc.) continues to be a widely used method of providing electrical interconnection between two locations within a package (e.g., between a bond pad of a semiconductor die and a lead of a leadframe). For example, ribbon bonding machines are used to form ribbon interconnections between respective locations to be electrically interconnected. The upper terminal end of a bonding tool is, in many instances, configured to be engaged in a transducer (e.g., an ultrasonic transducer) of a ribbon bonding system which causes the bonding tool to vibrate upon bonding. Ultrasonic bonding is a joining process that, for example, may use relative motion between the ribbon (e.g., a conductive ribbon material such as an aluminum ribbon, a copper ribbon, an aluminum-copper clad ribbon, a silver coated aluminum ribbon, a silver coated copper ribbon, a light capturing ribbon for bonding to solar substrates, etc.) and the surface to which it is bonded. It is this relative motion that enables the bond formation.

In providing interconnection in solar substrate applications (e.g., crystalline silicon solar cells, thin film solar cells, etc.), techniques such as soldering or conductive adhesive bonding have been used to electrically connect adjacent cells, to collect electricity from multiple cells, etc. When using ultrasonic ribbon bonding in such applications, it would be desirable to provide improved workholders and workholder capabilities, and improved ribbon feeding systems and ribbon feeding capabilities.

SUMMARY OF THE INVENTION

According to an exemplary embodiment of the present invention, an ultrasonic ribbon bonding system is provided. The ultrasonic ribbon bonding system includes a workholder for supporting a workpiece during a ribbon bonding operation. The workholder defines a first plurality of standoffs extending above a surface of the workholder, the first plurality of standoffs configured to contact the workpiece during the ribbon bonding operation. The ultrasonic ribbon bonding system also includes a bond head assembly carrying a ribbon bonding tool, the ribbon bonding tool being configured to bond a ribbon to the workpiece during the ribbon bonding operation.

For example, the first plurality of standoffs may be primary standoffs (and/or secondary standoffs) of a back side workholder such as workholders 200, 400, 500, 600, 700, 800, 900, 1000, etc., described herein. In another example, the first plurality of standoffs may be standoffs of a front side workholder such as workholders 1200, 1400, 1500, 1600, 1700, etc., described herein.

According to another exemplary embodiment of the present invention, a solar substrate ribbon bonding system is provided. The solar substrate ribbon bonding system includes a workholder for supporting a solar substrate during a ribbon bonding operation, the workholder defining a first plurality of standoffs extending above a surface of the workholder, the first plurality of standoffs configured to contact the solar substrate during the ribbon bonding operation. The solar substrate ribbon bonding system also includes a bond head carrying a ribbon bonding tool, the ribbon bonding tool being configured to bond a ribbon to the solar substrate during the ribbon bonding operation.

According to another exemplary embodiment of the present invention, a method of ultrasonically bonding a ribbon material to a workpiece is provided. The method includes the steps of: (1) providing a workpiece with a conductive region; (2) providing a workholder to support the workpiece during a ribbon bonding operation, the workholder defining a first plurality of standoffs extending above a surface of the workholder, the first plurality of standoffs configured to contact the workpiece during the ribbon bonding operation; (3) providing a ribbon material to at least partially overlie the conductive region; and (4) ultrasonically bonding the ribbon material to the conductive region using a ribbon bonding tool carried by a bond head assembly.

According to another exemplary embodiment of the present invention, an ultrasonic ribbon bonding system is provided. The system includes: (a) an XY assembly; (b) a bond head assembly carried by the XY assembly; (c) a ribbon bonding tool supported by the bond head assembly; (d) a ribbon supply for providing ribbon; and (e) a ribbon guide, carried by the XY assembly, for guiding the ribbon from the ribbon supply to a position proximate the ribbon bonding tool. The bond head assembly being configured to travel along a substantially vertical axis, independent of the ribbon guide, such that the ribbon bonding tool is adapted to form a ribbon bond.

BRIEF DESCRIPTION OF THE DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

Figure 1A:
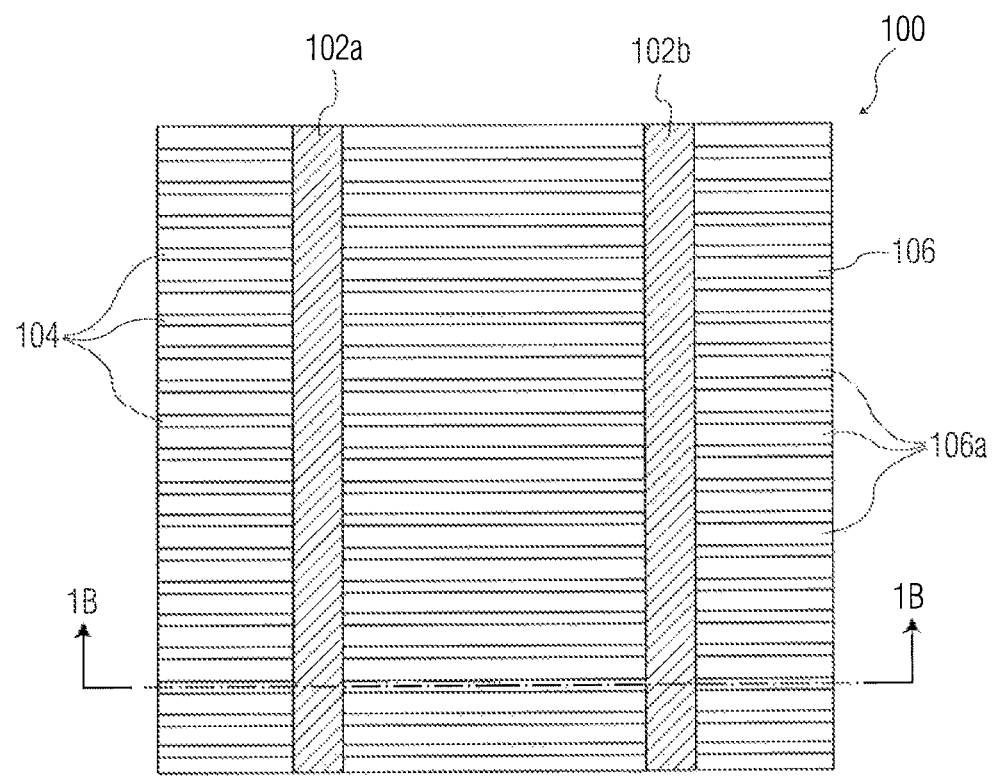
FIG. 1A is a plan, overhead view of a front side of a workpiece for bonding in accordance with an exemplary embodiment of the present invention.

According to various exemplary embodiments of the present invention, aspects of ultrasonic bonding systems (e.g., ribbon bonding systems including workholders and ribbon feeding systems), will now be described. The ribbon bonding system ultrasonically bonds a ribbon material (e.g., a conductive ribbon material) to a substrate/workpiece (e.g., a solar substrate such as a crystalline silicon solar substrate, a thin film solar substrate, etc.). The ribbon is supplied by a ribbon supply (e.g., a ribbon spool), and is carried by a ribbon guide that positions a free end of the ribbon proximate a ribbon bonding tool. The ribbon guide and a bond head assembly are both carried by an XY assembly (e.g., an XY table) of the ribbon bonding system along an X-axis and a Y-axis. The ribbon guide may be configured to travel along a substantially vertical axis (e.g., a Z-axis of an ultrasonic bonding machine) in relation to the XY assembly. The bond head assembly carries the ribbon bonding tool, amongst other elements, such as a cutter for cutting the ribbon. The bond head assembly may move, with respect to the XY assembly, along a vertical Z-axis, and about a rotative theta (Θ) axis in an XY plane. In certain exemplary embodiments of the present invention, the ribbon guide is not carried by the bond head assembly, and as such, does not move along such a vertical Z-axis, and/or about the rotative theta (Θ) axis, with the elements of the bond head assembly (e.g., the ribbon bonding tool, the cutter, etc).

The ribbon bonding systems, and in particular the workholder structures and/or the ribbon feeding systems of the ribbon bonding systems, may have particular applicability to ribbon bonding of solar substrates (e.g., crystalline silicon solar substrates, thin film solar substrates, etc.). An exemplary solar substrate includes a front side and a back side. The front side includes exposed active solar material (for receiving light energy and converting the light energy into electrical energy). The front side may (or may not) include electrical interconnection and collection structures such as busbars and/or current fingers. The back side, which typically does not include exposed active solar material, may include a conductive back plane covering much (if not all) of the back side. Ribbon material may be bonded, as desired in the given application, to one or both of the front side (e.g., see FIGS. 11A-18 and related text below) and the back side (e.g., see FIGS. 1A-3H, 4-9 and related text below) of the solar substrate. That is, in certain applications conductive ribbon material may be used to provide interconnection between: (1) the front side of one solar substrate to the front side of another solar substrate; (2) the back side of one solar substrate to the back side of another solar substrate; (3) the front side of one solar substrate to the back side of another solar substrate, etc. During such ribbon bonding operations, the solar substrates are desirably secured in place using workholders or the like. Also an improved ribbon feeding system (e.g., see FIGS. 3G-3H and related text below) may be provided.

Figure 1B:
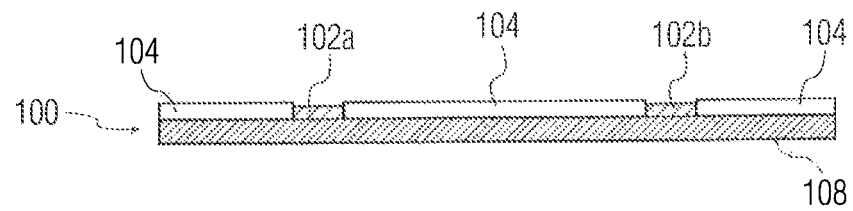
FIG. 1B is a cut away view of FIG. 1A taken along line 1B-1B.

FIG. 1A illustrates front side 106 of exemplary workpiece 100. In the illustrated example, workpiece 100 is a solar substrate, and more specifically, is a crystalline silicon solar substrate; however, it is understood that alternative solar substrates (e.g., thin film solar substrates) and other workpieces (not solar substrates) are contemplated. Front side 106 includes exposed active solar material 106a. Conductive busbars 102a, 102b and current fingers 104 are provided on active solar material 106a. Current fingers 104 transmit electrical current to busbars 102a, 102b. In the illustrated example, current fingers 104 are arranged substantially perpendicular to busbars 102a, 102b, although alternate arrangements are contemplated. For example, the conductive regions on front side 106 may not include current fingers and/or busbars but may take alternate configurations. Further, there may be more or less busbars, and more or less current fingers, than that shown in FIG. 1A. In FIGS. 1A-1B, busbars 102a, 102b have a lower height above the surface of exposed active material 106a than current fingers 104; however, it is understood that current fingers 104 may have the same height, or even a lower height, than that of busbars 102a, 102b. Further still, it is understood that the profile shape of busbars 102a, 102b and current fingers 104 may differ from that illustrated in FIGS. 1A-1B. That is, while FIG. 1B illustrates a substantially flat profile of busbars 102a, 102b and current fingers 104, either, or both, busbars 102a, 102b and current fingers 104 may have a convex or concave profile, and either or both of busbars 102a, 102b and current fingers 104 may have aspect ratios (i.e., height to width ratios) in a large range. FIG. 1B also illustrates back side 108 of workpiece 100. Back side 108 may be defined by a substantially uniform conductive layer such as an aluminum layer (e.g., aluminum thick-film, an aluminum metal layer, other metal layers or platings such as copper, nickel plated copper, etc.), and may have specific areas intended to connect the ribbon or ribbons, such as conductive pads or the like.

Figure 2:
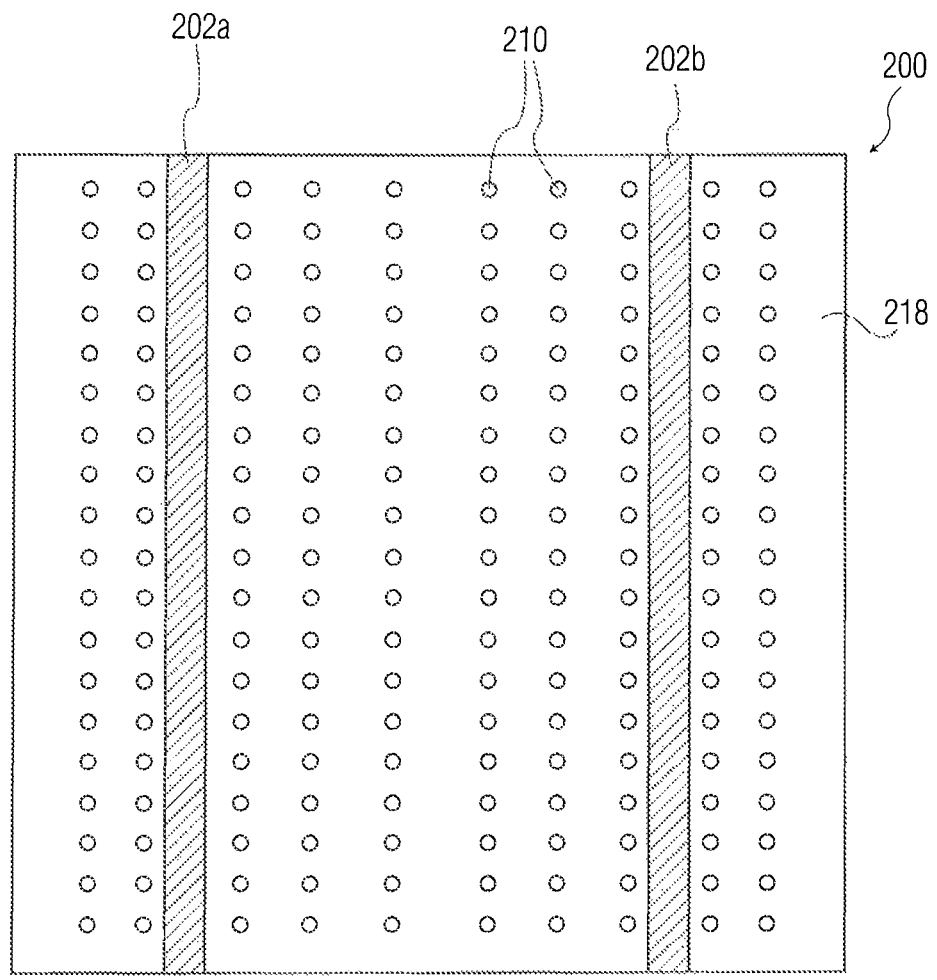
FIG. 2 is a plan, overhead view of a workholder for bonding of a workpiece in accordance with an exemplary embodiment of the present invention.

FIG. 2 is a plan, overhead view of workholder 200 in accordance with an exemplary embodiment of the present invention. For example, workholder 200 is configured to support the front side of a solar substrate (e.g., in a configuration with front side 106 of solar substrate 100 down) during a bonding operation on the back side of a solar substrate (e.g., see FIGS. 3A-3H, 4-9, and 10A-10B discussed below). During an exemplary bonding operation, conductive ribbon material is bonded to one or more conductive regions on backside 108 of solar substrate 100. Workholder 200 defines first plurality of standoffs (or projections) 202a, 202b which extend above upper surface 218 of workholder 200. Standoffs 202a, 202b may be sized and spaced to contact and support respective busbars 102a, 102b during the back side bonding operation, and may be numbered to correspond to the number of busbars 102 of substrate 100 to be bonded. A plurality of through-holes 210 are arranged in rows and columns apart from standoffs 202a, 202b, although other configurations of through-holes 210 are contemplated.

Figure 4:
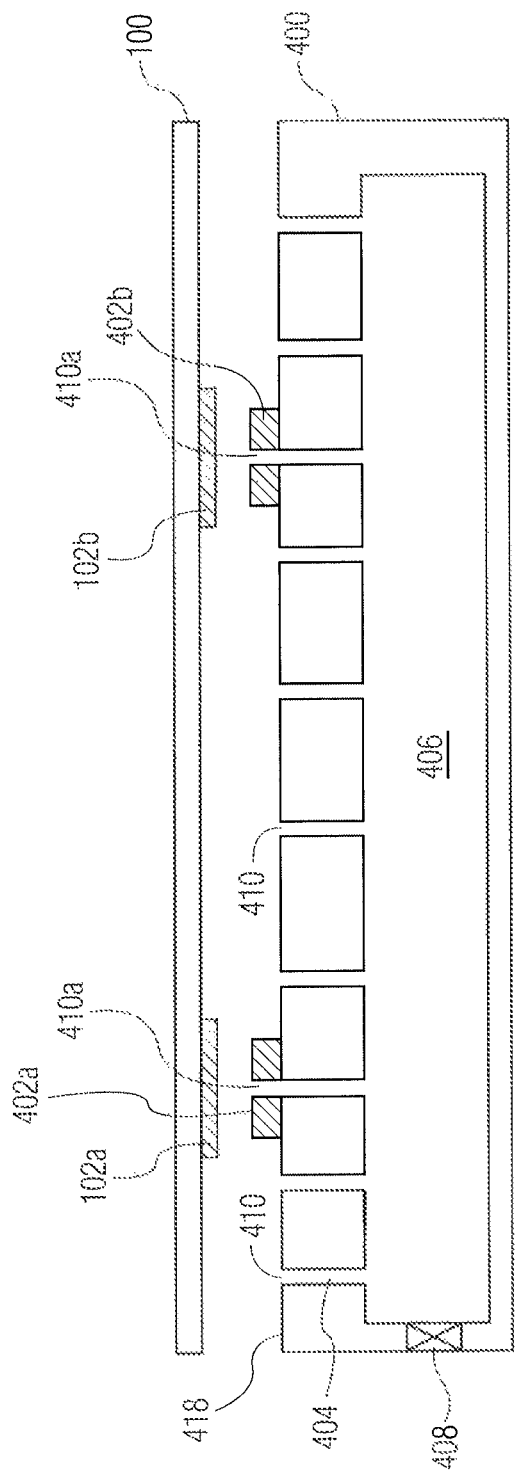
FIGS. 4-9 are side cut away views of workholder structures for use in bonding of a workpiece in accordance with various exemplary embodiments of the present invention.
Figure 5:
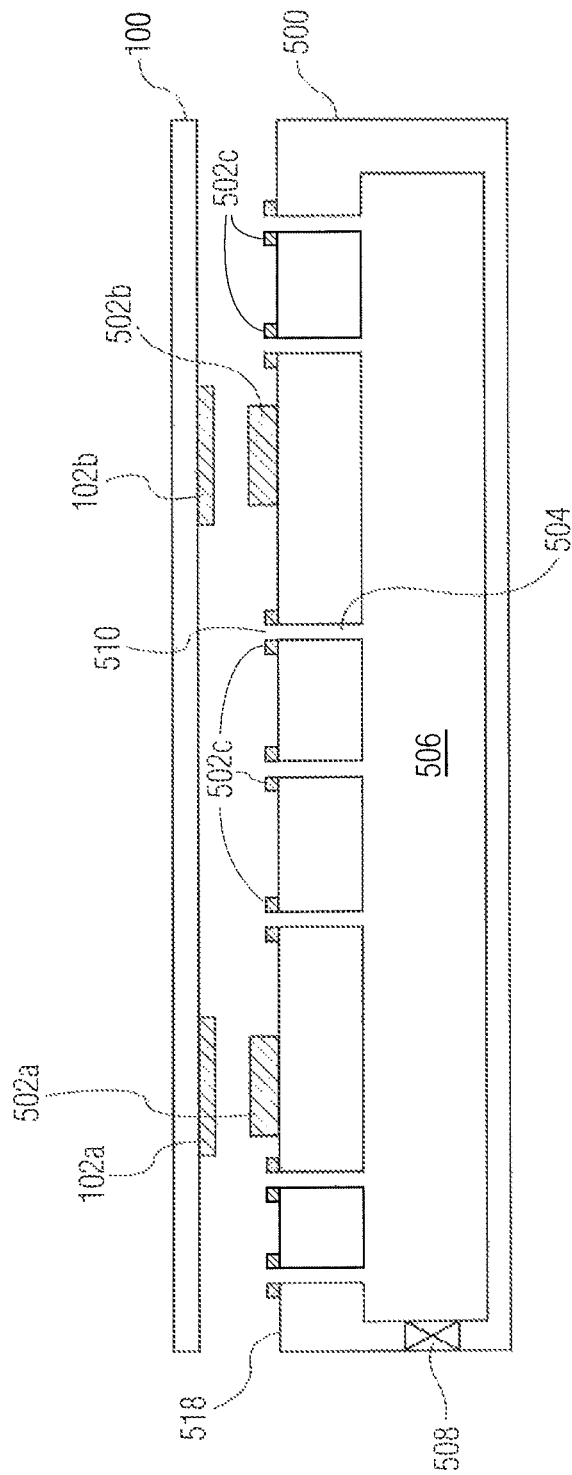

FIGS. 3A-3H, 4-9, and 10A-10B illustrate various exemplary configurations of workholders of bonding systems according to exemplary embodiments of the present invention. Throughout the drawings, like reference numerals are intended to refer to like elements unless indicated otherwise. Thus, FIGS. 2 and 3A-3H illustrate primary standoffs 202a, 202b. FIG. 4 illustrates primary standoffs 402a, 402b; FIG. 5 illustrates primary standoffs 502a, 502b; and so on.

Figure 3A:
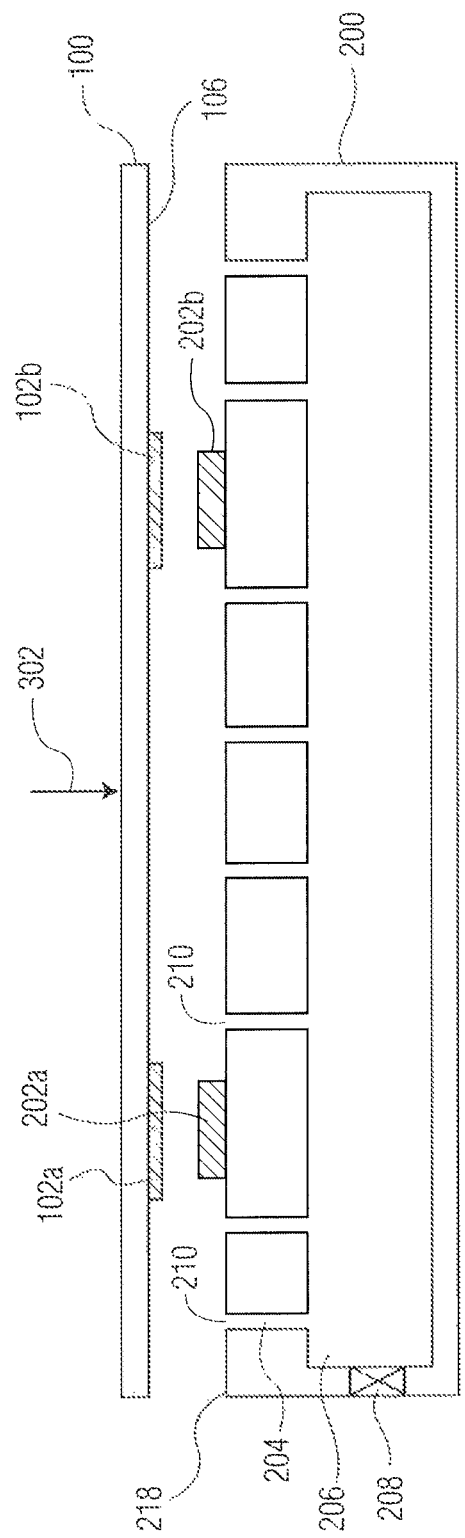
FIGS. 3A-3F are a series of side cut away views of bonding a workpiece in accordance with an exemplary embodiment of the present invention.

Referring specifically now to FIGS. 3A-3F, an exemplary series of side cut away views illustrating a ribbon bonding operation on a workpiece are shown. Exemplary workholder 200 is substantially similar to that as illustrated in FIG. 2 (although only 4, and not 6, through-holes 210 are illustrated between standoffs 202a, 202b for simplicity). In this example, workpiece 100 is solar substrate 100 (e.g., a crystalline silicon solar substrate) including busbars 102a, 102b on its frontside 106 (e.g., as illustrated and described with respect to FIG. 1). In FIG. 3A, solar substrate 100 is positioned over upper surface 218 of workholder 200 with busbars 102a, 102b aligned with a respective pair of standoffs 202a, 202b, and substrate 100 is moved downward, as at arrow 302 (see below). Solar substrate 100 also includes current fingers (not shown but see, e.g., current fingers 104 of FIG. 1) extending between, and outward from, busbars 102a, 102b.

Workpiece 100 is desirably accurately placed onto workholder 200 during a bonding operation, particularly in the direction perpendicular to busbars 102a, 102b, and particularly if the current fingers are higher than the busbars 102a, 102b. However, the position of the busbar-current finger pattern relative to an edge of workpiece 100 may vary significantly (e.g., with position variation up to +/−1.0 mm). In such a case placement of workpiece 100 relative to its edge is not sufficient, and placement based on pattern recognition on the busbar-current finger structure is desirably utilized. Pattern recognition can be performed during cell placement, for example, with (1) a camera in, or looking through, workholder 200, (2) a look-up, or look-down camera that is moved in between workholder 200 and workpiece 100, or (3) a calibrated camera off workholder 200 to measure the workpiece's front-side structure before workpiece placement to make appropriate position adjustments during workpiece placement, amongst other techniques.

Workholder 200 includes channels 204 connecting respective through-holes 210 to chamber 206. Chamber 206 in turn is in communication with a negative fluid drawing source (e.g., a fluid pump (not shown) similar in certain respects to a vacuum source) by valve 208 configured to be open to draw fluid through through-holes 210, or closed (as illustrated by the "X" in FIG. 3A). The fluid pump is configured to withdraw fluid (ambient atmosphere/air) from chamber 206 as will be discussed in greater detail below.

Figure 3B:
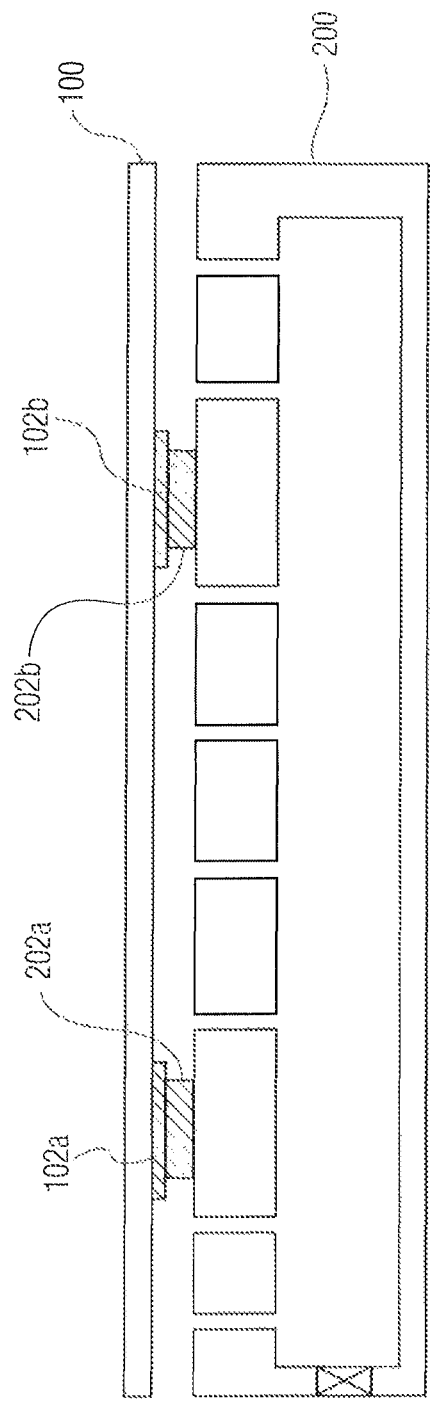
Figure 3C:
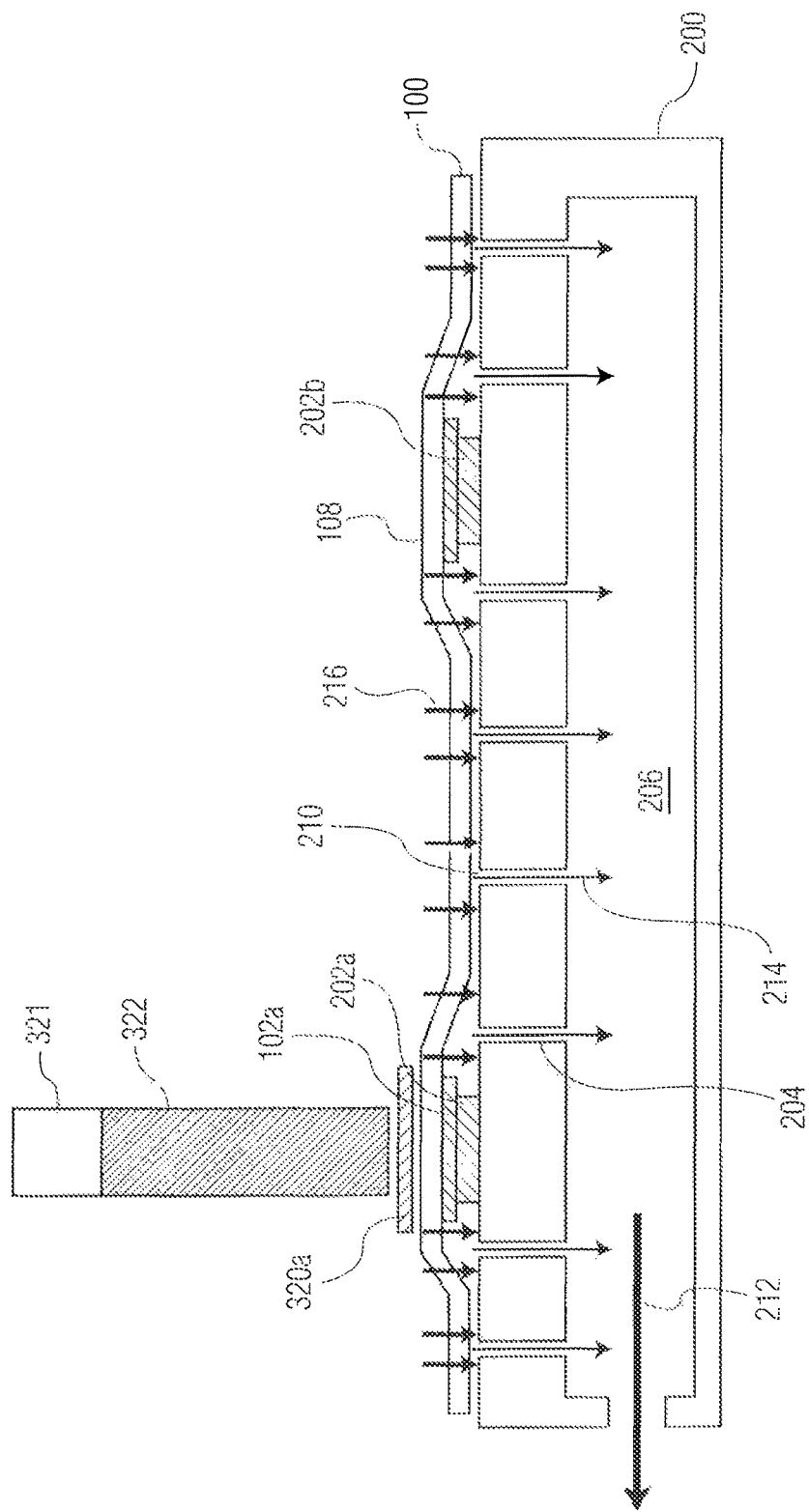

In FIG. 3B, solar substrate 100 has been lowered such that each busbar 102a, 102b contacts, and is supported by, respective standoffs 202a, 202b. FIG. 3C illustrates activation of the fluid pump (not shown) to withdraw fluid (e.g., ambient atmosphere/air as at arrow 212) from chamber 206 to create a negative fluid pressure through the plurality of through-holes 210 via channels 204, as at arrows 214. This provides downward pulling force, as at arrows 216, on workpiece/solar substrate 100 which secures solar substrate 100 to workholder 200 during a bonding process, and may cause bending of solar substrate 100 as illustrated. The bending of substrate 100 may be exaggerated in FIG. 3C (and in FIGS. 3D-3E) for illustration to show the downward pulling force, as it is understood that it is generally undesirable to bend a solar substrate.

The amount of downward pulling force 216 is related to the withdrawal pressure 212 exerted by the fluid pump and the size and arrangement of through-holes 210/channels 204. Various factors, such as the spacing of through-holes 210 from standoffs 202a, 202b, and the height and spacing of the current fingers, may affect the amount of bending of solar substrate 100. Generally, the less the bending of solar substrate 100 the better in order to minimize potential cracking of solar substrate 100 during retention of substrate 100 to workholder 200, and during the bonding of conductive material to back side 108 of substrate 100. For example, maintaining solar substrate in a position as flat as possible tends to provide the best conditions for optimized/efficient ultrasonic bonding of ribbons that remain as flat as possible after bonding. Bond head assembly 322 (carried by XY table 321 which is only illustrated in FIG. 3C for simplicity), with first conductive material/conductive backside ribbon (material) 320a, is then positioned over solar substrate 100 so as to overlie busbar 102a (supported by primary standoff 202a).

Figure 3D:
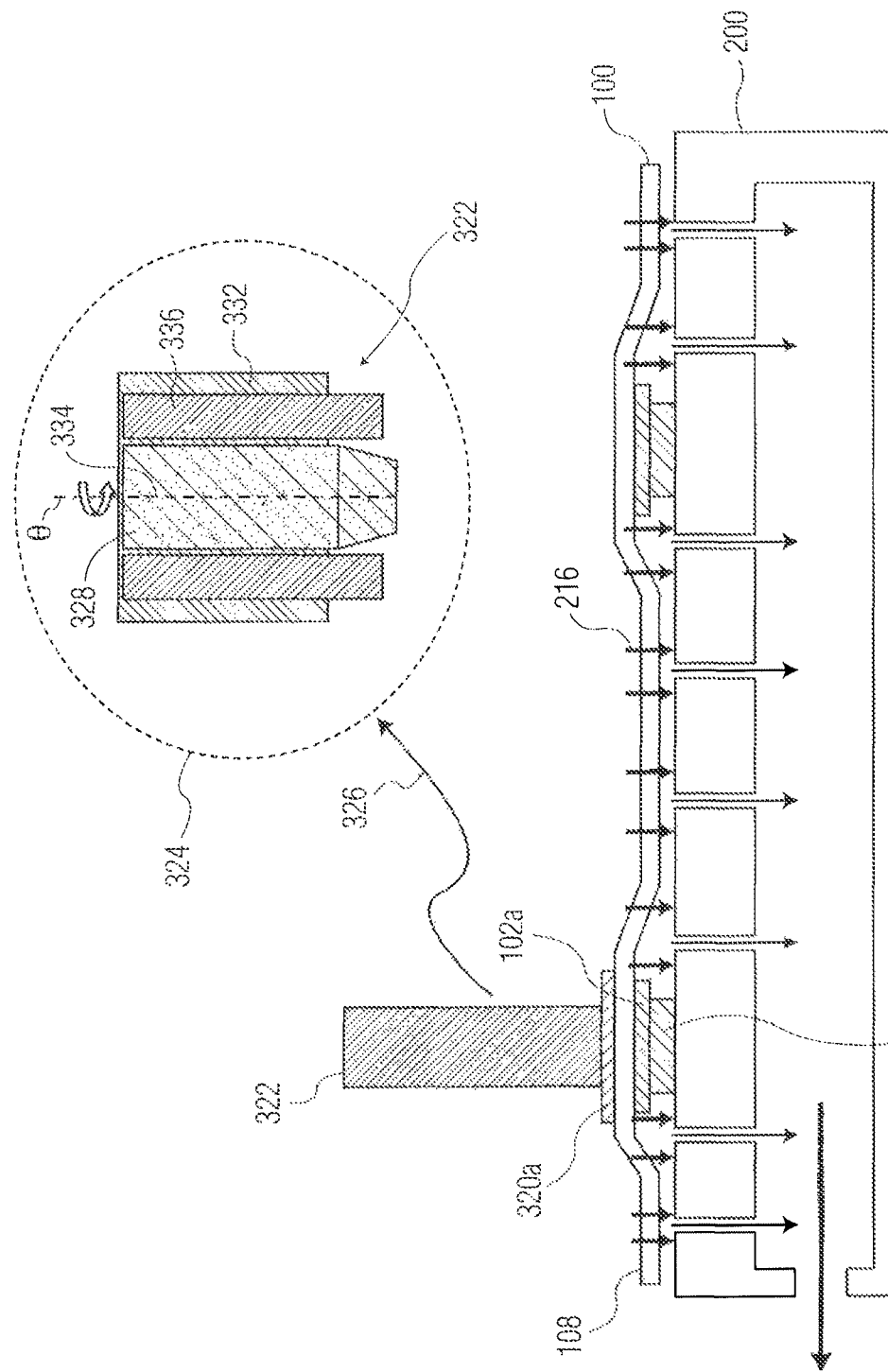

FIG. 3D illustrates bond head assembly 322 bonding first backside ribbon 320a onto back side 108 of solar substrate 100 opposite busbar 102a (that is supported by standoff 202a). The withdrawal of air by a fluid pump maintains downward pulling force 216 on solar substrate 100 so that substrate 100 is secured to workholder 200 so as to permit efficient and effective bonding of first backside ribbon 320a to substrate 100.

Details of an exemplary bond head assembly 322 are shown in dashed circle 324 as directed by arrow 326. Specifically, bond head assembly 322 includes ribbon bonding tool 328, pressing member 336 proximate bonding tool 328, and cutter 332 behind, and proximate to, bonding tool 328 as illustrated in circle 324. Bonding tool 328, pressing member 336 and cutter 332 may rotate about bonding tool axis 334 using a theta axis motion system of bond head assembly 322. That is, bond head assembly 322 is configured to rotate in an XY plane about a theta (Θ) axis such that cutter 322 rotates about the theta axis with bond head assembly 322. Such rotation may be used, if desired, to align cutter 332 in a desired position after bonding to cut the ribbon material. Pressing member 336 is carried by bond head assembly 322, and is configured for pressing against backside ribbon 320a adjacent a bonded portion of backside ribbon 320a, and is moveable with respect to bond head assembly 322 independent of bonding tool 328. During bonding of first backside ribbon 320a to substrate back side 108, bonding tool 328 and pressing member 336 may be positioned such that after a bond is formed between first backside ribbon 320a and solar substrate 100, pressing member 336 is lowered/maintained in a downward position so as to contact first backside ribbon 320a proximate such bond. Thus, when bonding tool 328 is raised, first backside ribbon 320a may be held down by pressing member 336 to permit tool 328 to separate from that bonded portion of first backside ribbon 320a (e.g., in the event of tool 328 sticking to first backside ribbon 320a). Pressing member 336 may then be raised to permit relocation of bond head assembly 322 over the next bonding position.

Once a length of first backside ribbon 320a has been bonded to substrate 100 over the length of supported busbar 102a (which may include multiple bonded portions along the length of the ribbon), bond head assembly 322 may then be rotated to permit cutter 332 to be positioned close to bonding tool 328. Of course, such rotation may not be used in a configuration where the cutter is already in line with the ribbon during bonding. Cutter 332 is then lowered to at least partially cut through first backside ribbon 320a. If cutter 332 has not completely severed bonded first backside ribbon 320a from a ribbon supply (e.g., a ribbon spool), then the ribbon may be held (e.g., using a clamp or clamping assembly) proximate a ribbon guide (not shown) near bonding tool 328, and bond head assembly 322 may be raised/moved so that first backside ribbon 320a is completely separated from ribbon supply 308 at the cut formed by cutter 332. It is noted that cutter 332 may be positioned at a number of locations including, for example: (1) in a position behind bonding tool 328 as illustrated in circle 324 (i.e., bonding tool 328 is positioned between cutter 322 and a ribbon guide); (2) in a position in front of bonding tool 328 where cutter 332 would obstruct the view of bonding tool 328 and pressing member 336 in circle 324 (i.e., cutter 322 is positioned between bonding tool 328 and a ribbon guide), amongst others. It is noted that the same procedure may apply to bonding second backside ribbon 320b to substrate 100 over second busbar 102b (e.g., see FIG. 3E), using bond head assembly 322 (or even a distinct bond head assembly including a distinct bonding tool, not shown).

Figure 3E:
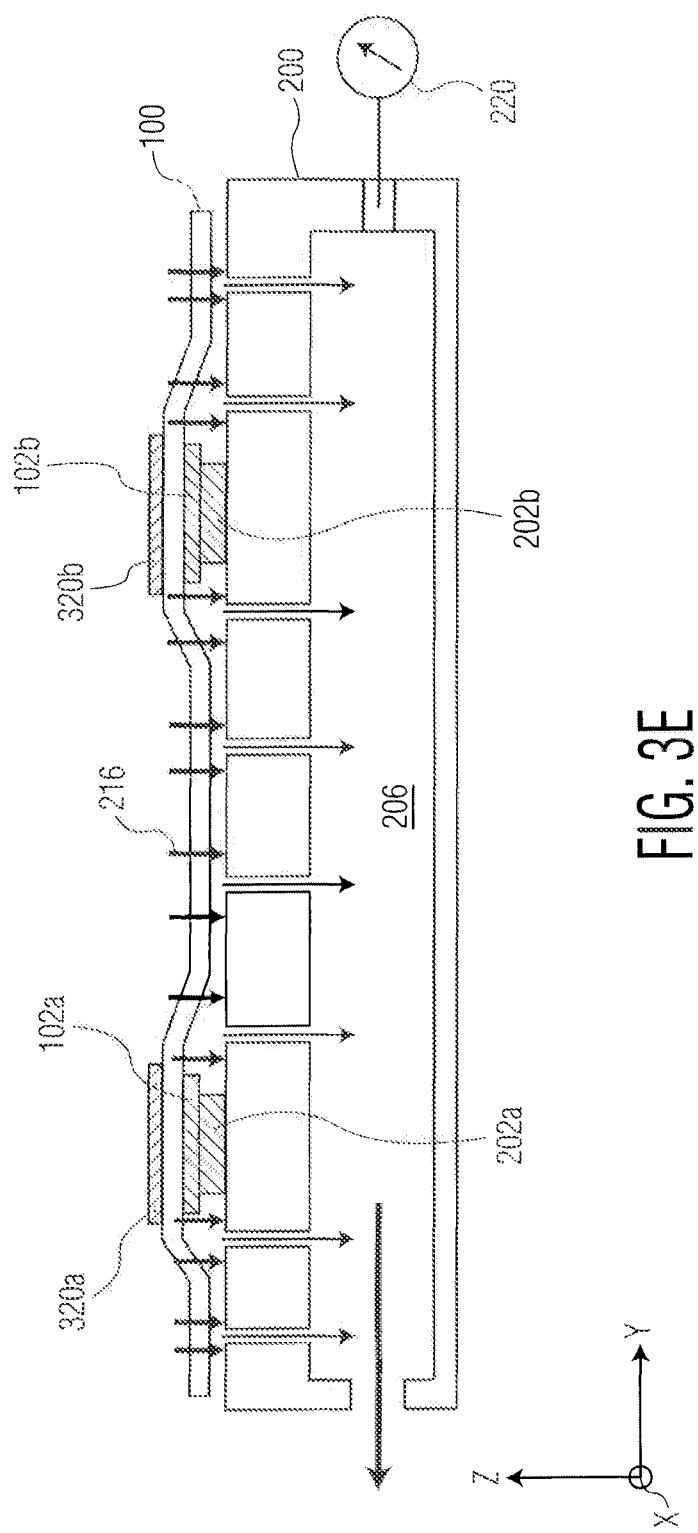
Figure 3F:
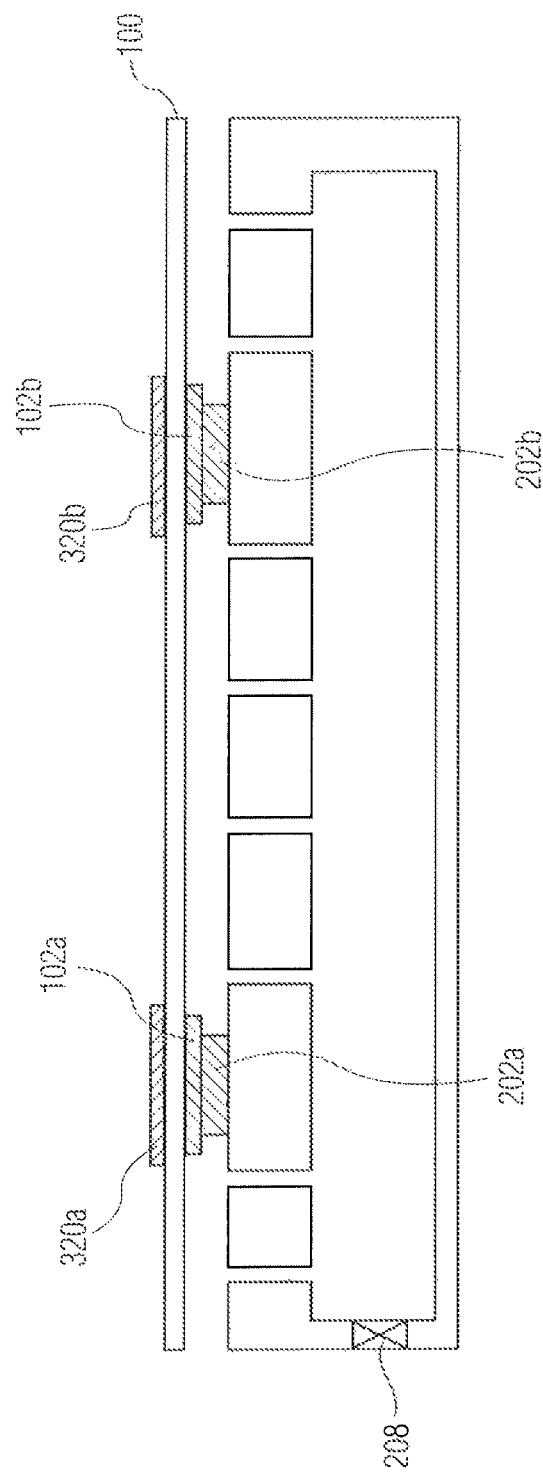

FIG. 3E illustrates first backside ribbon 320a and second backside ribbon 320b bonded to solar substrate 100 over respective first and second busbars 102a, 102b (supported by respective standoffs 202a, 202b) with downward force 216 still applied to substrate 100. Pressure indicator 220 (e.g., gauge 220, shown only in FIG. 3E for simplicity) may be used to establish the appropriate amount of negative fluid pressure within chamber 206. FIG. 3F illustrates first backside ribbon 320a and second backside ribbon 320b bonded to solar substrate 100 over respective first and second busbars 102a, 102b (supported by respective standoffs 202a, 202b) with valve 208 now closed (as indicated by the "X"). Thus, the downward force is eliminated and solar substrate 100 returns to a substantially flat profile as illustrated. The now bonded solar substrate 100 (with backside ribbons 320a, 320b bonded over respective busbars 102a, 102b) may then be available for further processing as the application requires.

Figure 3G:
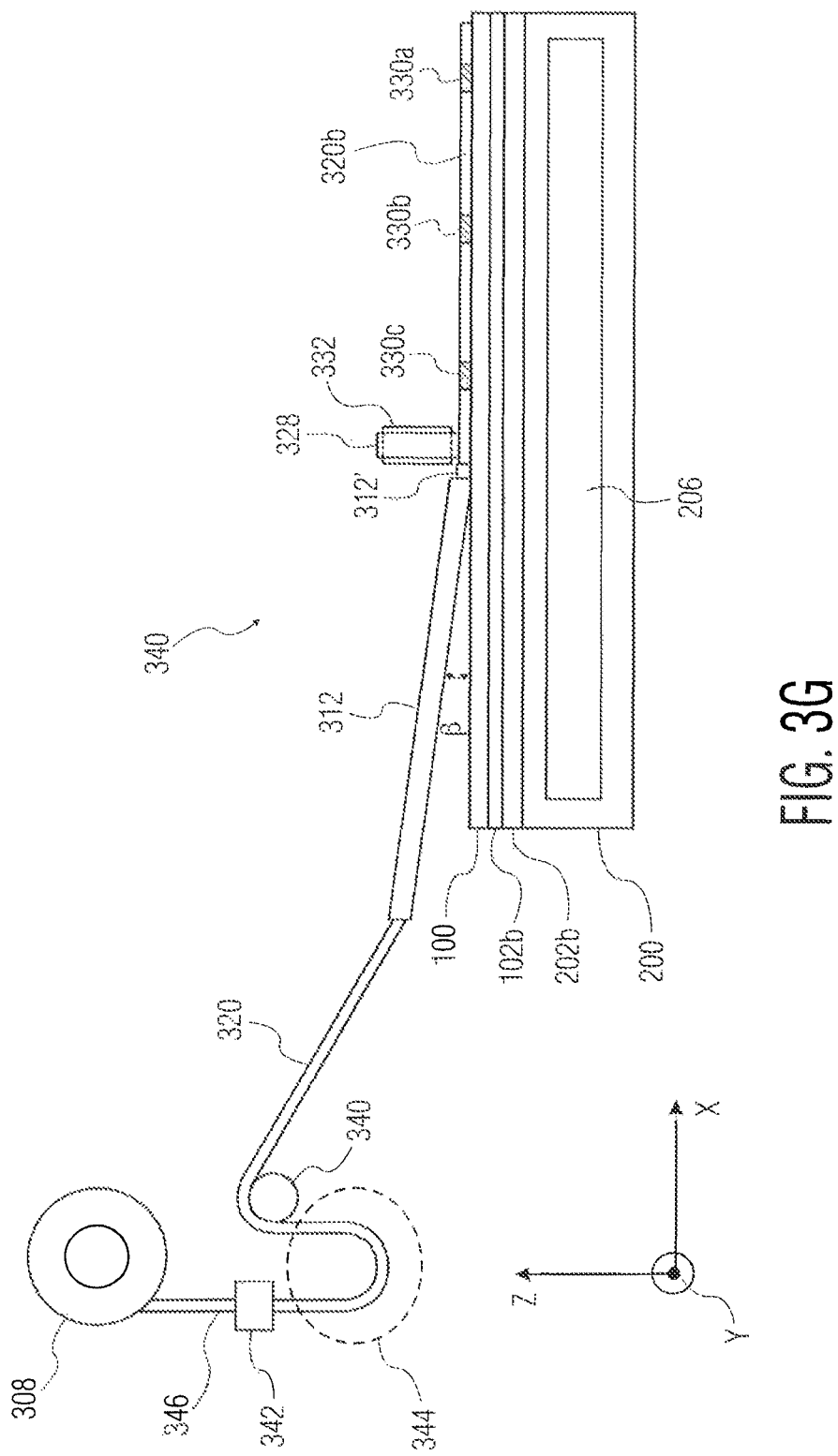
FIG. 3G is a side view of bonding a workpiece in accordance with an exemplary embodiment of the present invention.

FIG. 3G is a side view of FIG. 3E (turned 90 degrees clockwise) during bonding of ribbon 320 to substrate 100 and illustrating a bonded ribbon portion 320b. FIG. 3G illustrates a point in time in the sequence of bonding ribbon 320 to workpiece 100. Bonded portions 330a, 330b, 330c have been formed between ribbon 320 and workpiece 100 using bonding tool 328 to form bonded ribbon length 320b. In the example shown in FIG. 3G, bonded portions 330a, 330b, 330c have been formed through an ultrasonic vibrating motion of bonding tool 328 where the vibrating motion extends in a direction substantially perpendicular to a length of ribbon 320 (i.e., along the y-axis). Of course, the vibrating motion may extend in a direction along the x-axis (e.g., in a direction substantially parallel to a length of ribbon 320, that is, in a direction along the length of the ribbon), or further still another direction. Ribbon supply 308 (e.g., spool 308 of ribbon material) provides ribbon 320 that is guided by ribbon guide 312 to a position over workpiece 100 and proximate ribbon bonding tool 328 (e.g., a position under tool 328). Although not shown, ribbon guide 312 may include a mechanism (e.g., a roller mechanism, etc.) for guiding and feeding ribbon 320 to bonding tool 328. A feeding mechanism may be used for feeding ribbon 320 from ribbon supply 308. Specifically (as illustrated in FIG. 3G), ribbon 320 extends from ribbon supply 308 through tensioner 342 (that may be configured to feed ribbon 320 through ribbon guide 312). Tensioner 342 is configured to provide a predetermined amount of tension to ribbon 320 between ribbon supply 308 and tensioner 342, and may be configured to feed ribbon 320 through ribbon guide 312. Further, tensioner 342 may be configured to substantially reduce the potential for de-spooling of ribbon material 320 from ribbon supply 308. Further still, tensioner 342 may be configured to straighten the ribbon and/or to remove some bends (e.g., sideways bends) from the ribbon. Ribbon 320 forms ribbon buffer 344 (e.g., a slack length of ribbon 320 between ribbon supply 308 and ribbon guide 312) that may include a length of ribbon 320 of a predetermined length. Bar 340 directs ribbon 320 from ribbon buffer 344 to ribbon guide 312. Ribbon guide 312 may include a tube extending from ribbon buffer 344 to bonding tool 328. Ribbon 320 is secured in a position under bonding tool 328 (with cutter 332 shown behind bonding tool 328) prior to an ultrasonic ribbon bonding operation by the position of terminal end 312' of ribbon guide 312. Terminal end 312' of ribbon guide 312 is proximate bonding tool 328 and may limit placement of ribbon 320 proximate bonding tool 328 within a predetermined range in, for example, the Y direction. Ribbon guide 312 may guide ribbon 320 to a position proximate bonding tool 328 at an angle (illustrated in FIG. 3G as "β") between, for example, 1-10 degrees, 1-5 degrees, or 1-2 degrees with respect to a bond surface of the ultrasonic bonding system. Bonded ribbon portion 320b is over busbar 102b, supported by standoff 202b, which in turn is supported by workholder 200.

Figure 3H:
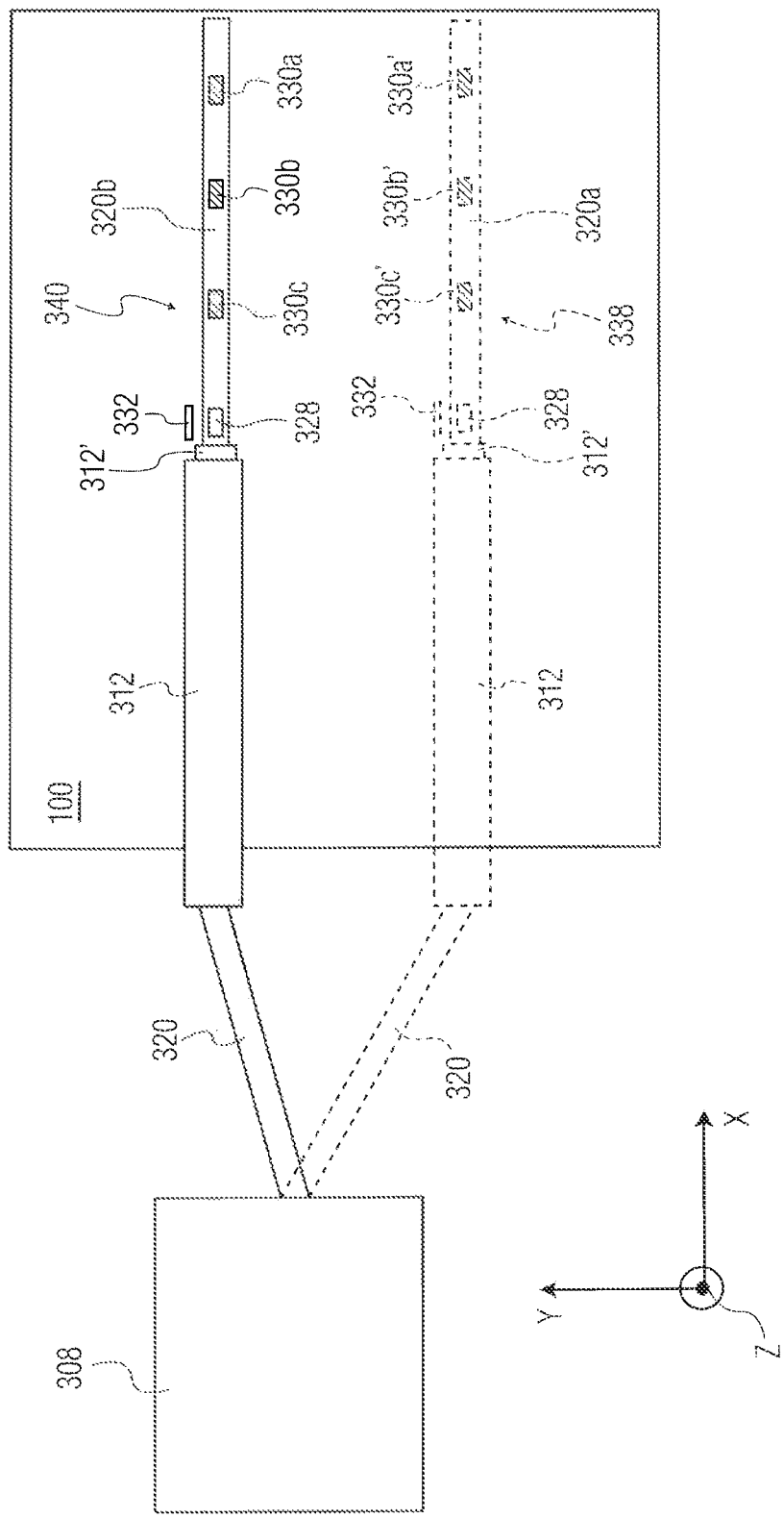
FIG. 3H is an overhead plan view of bonding a workpiece in accordance with an exemplary embodiment of the present invention.

FIG. 3H is a top block diagram view of FIG. 3G illustrating a ribbon bonding system configured to successively bond conductive ribbon to two adjacent, parallel regions on a single workpiece. Workpiece 100 (e.g., crystalline solar substrate 100) includes two parallel regions overlying parallel busbars (not shown in FIG. 3H, but see, e.g., busbars 102a, 102b illustrated in FIG. 3G) that are in turn supported by standoffs (not shown in FIG. 3H, but see, e.g., standoffs 202a, 202b). Ribbon 320, supplied from ribbon supply 308, is drawn through ribbon guide 312 (including terminal ribbon guide portion 312') to a position proximate ribbon bonding tool 328. Ribbon 320 is bonded to a portion of workpiece 100 overlying busbar 102b using ribbon bonding tool 328 by a first ribbon bonding process designated as arrow 340. Upper bonded ribbon length 320b includes bonded portions 330a, 330b, 330c between ribbon 320 and workpiece 100 overlying busbar 102b. Ribbon guide 312, bonding tool 328, and cutter 332 (all of which are carried by an XY assembly) continue moving to the left in the X direction forming additional bonded portions until ribbon 320 is bonded to substrate 100 over busbar 202b. Following completion of bonding upper bonded ribbon length 320b to substrate 100 over busbar 202b (through bonded portions 330a, 330b, 330c, etc.), ribbon 320 is severed (e.g., by using cutter 332) after completing bonded ribbon portion 320b, and ribbon 320 may be extended to another (initial) bonding location (e.g., the position of to be bonded portion 330a' overlying busbar 102a), such that ribbon 320 may be bonded thereto using bonding tool 328 during another/second ribbon bonding process designated as arrow 338 (and in dotted line relief). After bonds 330b', 330c', etc., are formed, ribbon 320 may then be cut by cutter 332 after completed bonded ribbon portion 320a. If during the cutting of ribbon 320 after either or both of completed bonded ribbon portions 320a, 320b, bond tool 328 is between ribbon guide 312 and cutter 332, the location of the cut relative to the last bond can be adjusted by, for example: (1) adjusting the position of cutter 332 relative to bond tool 328; and/or (2) positioning cutter 332 by moving the bond head accordingly after formation of the last bond of the completed bonded ribbon portion.

FIGS. 4-9 and 10A-10B illustrate various exemplary workholders (and substrates) in a position analogous to the relative position of substrate 100 and workholder 200 in FIG. 3A. While the operational sequence of each of these exemplary workholders (analogous to FIGS. 3B-3F) is not shown, it is understood that a sequence similar to that shown in FIGS. 3B-3F is contemplated for each of the exemplary workholders illustrated in FIGS. 4-9 and 10A-10B.

FIG. 4 illustrates solar substrate 100 (e.g., the same solar substrate illustrated and described and above with respect to FIGS. 1A-1B) positioned over exemplary workholder 400 with pair of busbars 102a, 102b aligned with respective standoffs 402a, 402b. Standoffs 402a, 402b extend above upper surface 418 of workholder 400, and channels 404 connecting respective through-holes 410 to chamber 406 (where chamber 406 is in communication with a negative fluid drawing source, through valve 408, similar to that described with respect to chamber 206 in FIG. 3A). FIG. 4 differs from the design shown in FIG. 3A in that FIG. 4 also includes through-holes 410a through standoffs 402a, 402b, and extending to chamber 406 such that an additional downward pulling force is provided by through-holes 410a. For example, through-holes 410a may desirably be positioned along standoffs 402a and 402b so as to not be located under bonding locations.

FIG. 5 illustrates solar substrate 100 positioned over exemplary workholder 500 with pair of busbars 102a, 102b aligned with respective (primary) standoffs 502a, 502b which extend from upper surface 518 of workholder 500. A plurality of secondary standoffs 502c extend from upper surface 518 of workholder 500 (standoffs 502c extending along the length of workholder 500 parallel to standoffs 502a, 502b). Secondary standoffs 502c have a height that is less than a height of primary standoffs 502a, 502b above upper surface 518 of workholder 500. Channels 504 extend from through-holes 510 at the top surface of secondary standoffs 502c to chamber 506 which in turn is connected to a fluid pump (not shown), where fluid/air is withdrawn through channels 504/through-holes 510 when valve 508 is opened (where channels are not defined through primary standoffs 502a, 502b).

Figure 6:
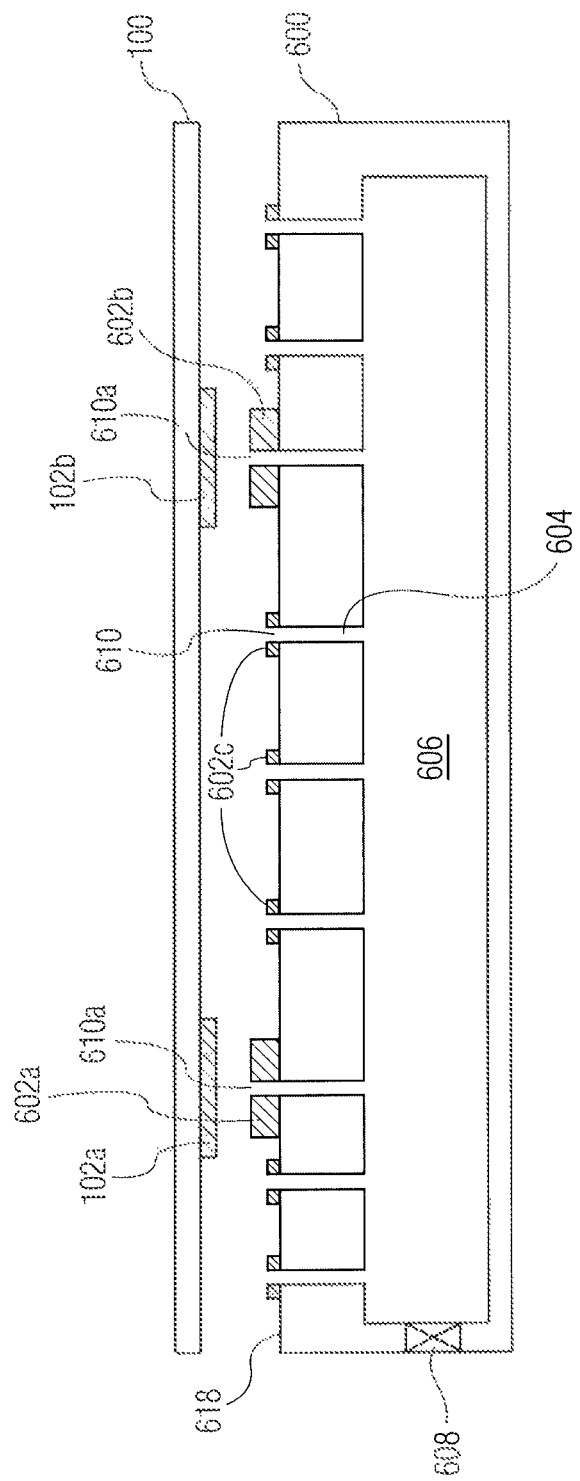

FIG. 6 illustrates solar substrate 100 positioned over exemplary workholder 600 with pair of busbars 102a, 102b aligned with respective standoffs 602a, 602b. Standoffs 602a, 602b, as well as secondary standoffs 602c (similar to secondary standoffs 502c in FIG. 5), extend above upper surface 618 of workholder 600. Channels 604 extend from through-holes 610 at the top surface of secondary standoffs 602c to chamber 606 which in turn is connected to a fluid pump (not shown). Through-holes 610a also extend from the top surface of primary standoffs 602a, 602b to chamber 606 (where chamber 606 is in communication with a negative fluid drawing source, through valve 608, similar to that described with respect to chamber 206 in FIG. 3A).

Figure 7:
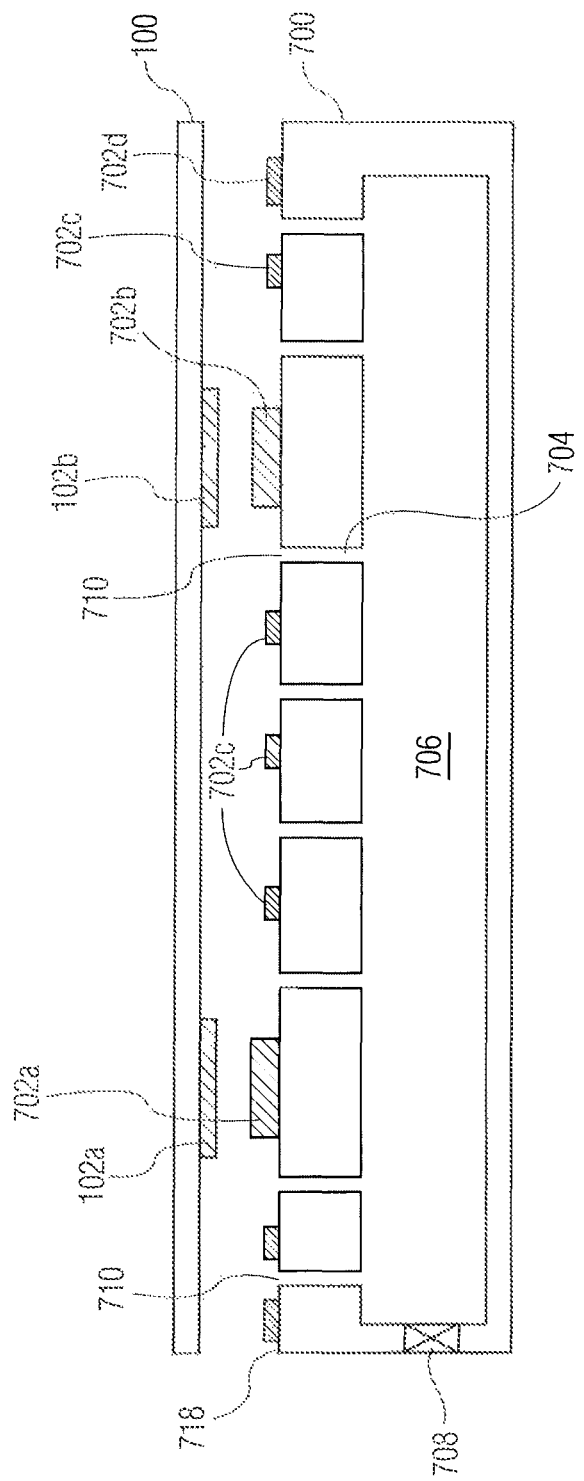

FIG. 7 illustrates solar substrate 100 positioned over exemplary workholder 700 with pair of busbars 102a, 102b aligned with respective standoffs 702a, 702b. Secondary standoffs 702c (having a height above upper surface 718 of workholder 700 that is less than such a height of primary standoffs 702a, 702b) are arranged substantially parallel to primary standoffs 702a, 702b. Channels 704 extend from through-holes 710 at top surface 718 of workholder 700 between ones of primary standoffs 702a, 702b and secondary standoffs 702c, 702d. Channels 704 extend to chamber 706 which in turn is connected to a fluid pump (not shown) through valve 708 (shown closed). It is noted that in this example, outer secondary standoffs 702d have a width that is greater than a width of secondary standoffs 702c, illustrating the point that the width of the secondary standoffs may vary along the width of workholder 700 (or any workholder according to the present invention).

Figure 8:
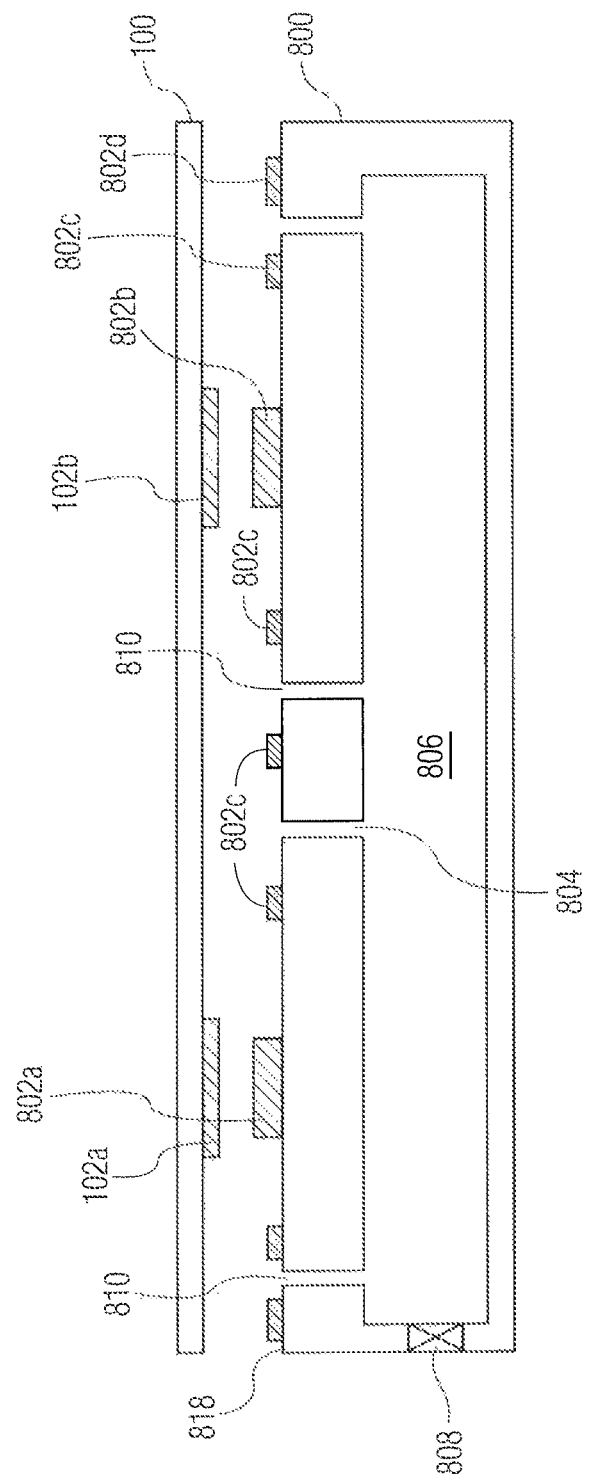

FIG. 8 illustrates solar substrate 100 positioned over exemplary workholder 800 with pair of busbars 102a, 102b aligned with respective standoffs 802a, 802b. Secondary standoffs 802c, 802d (having a height above upper surface 818 of workholder 800 that is less than such a height of primary standoffs 802a, 802b) are arranged substantially parallel to primary standoffs 802a, 802b. Channels 804 extend from through-holes 810 at top surface 818 of workholder 800 only between ones of secondary standoffs 802c, 802d. Channels 804 extend to chamber 806 which in turn is connected to a fluid pump (not shown) through valve 808 (shown closed). It is noted that workholder 800 differs from workholder 700 (in FIG. 7) in that through-holes 810 are not provided directly adjacent primary standoffs 802a, 802b as shown in FIG. 8. Such a configuration of through-holes 810 may: (1) reduce the amount of bending of substrate 100 at, and adjacent, busbars 102a, 102b, and thus may reduce the risk of cracking, or otherwise damaging, substrate 100; and/or (2) positively affect the bonding of a ribbon to the backside of solar substrate 100 above busbars 102a, 102b, by reducing, or not causing, a void underneath the bond location(s).

Figure 9:
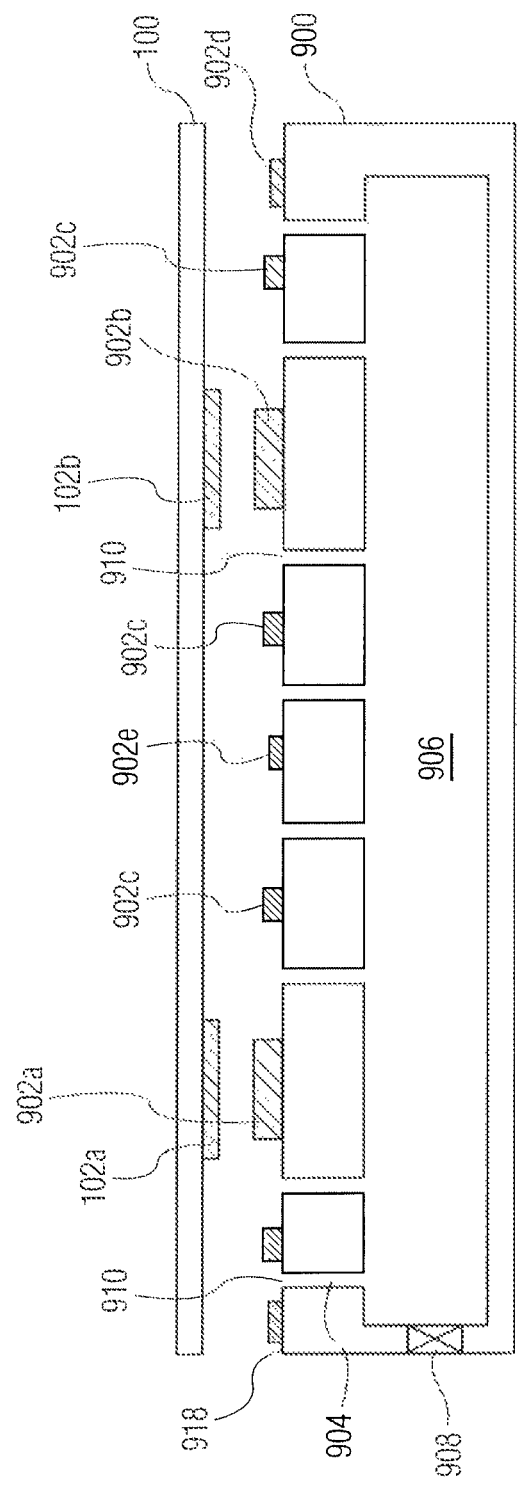

FIG. 9 illustrates solar substrate 100 positioned over exemplary workholder 900 with pair of busbars 102a, 102b aligned with respective standoffs 902a, 902b. Secondary standoffs 902c, 902d, and 902e are arranged substantially parallel to primary standoffs 902a, 902b. Secondary standoffs 902c have a height above upper surface 918 of workholder 900 that is less than such a height of primary standoffs 902a, 902b, and secondary standoffs 902d, 902e have another such a height that is less than the height of secondary standoffs 902c. This height 'step down' going from primary standoffs 902a, 902b, to secondary standoffs 902c, and then to secondary standoffs 902d, 902e may reduce the stress of solar substrate 100 when bent with the withdrawal of fluid/air by the fluid pump through through-holes 910. Of course, additional standoffs may be provided. Channels 904 extend from through-holes 910 at top surface 918 of workholder 900 between ones of primary standoffs 902a, 902b and secondary standoffs 902c, 902d, 902e. Channels 904 extend to chamber 906 which in turn is connected to a fluid pump (not shown) through valve 908 (shown closed). In this example, it is noted that outer secondary standoffs 902d have a width that is greater than a width of secondary standoffs 902c, 902e. This width differential may also reduce the stress on solar substrate 100 during the ultrasonic bonding process.

Figure 10A:
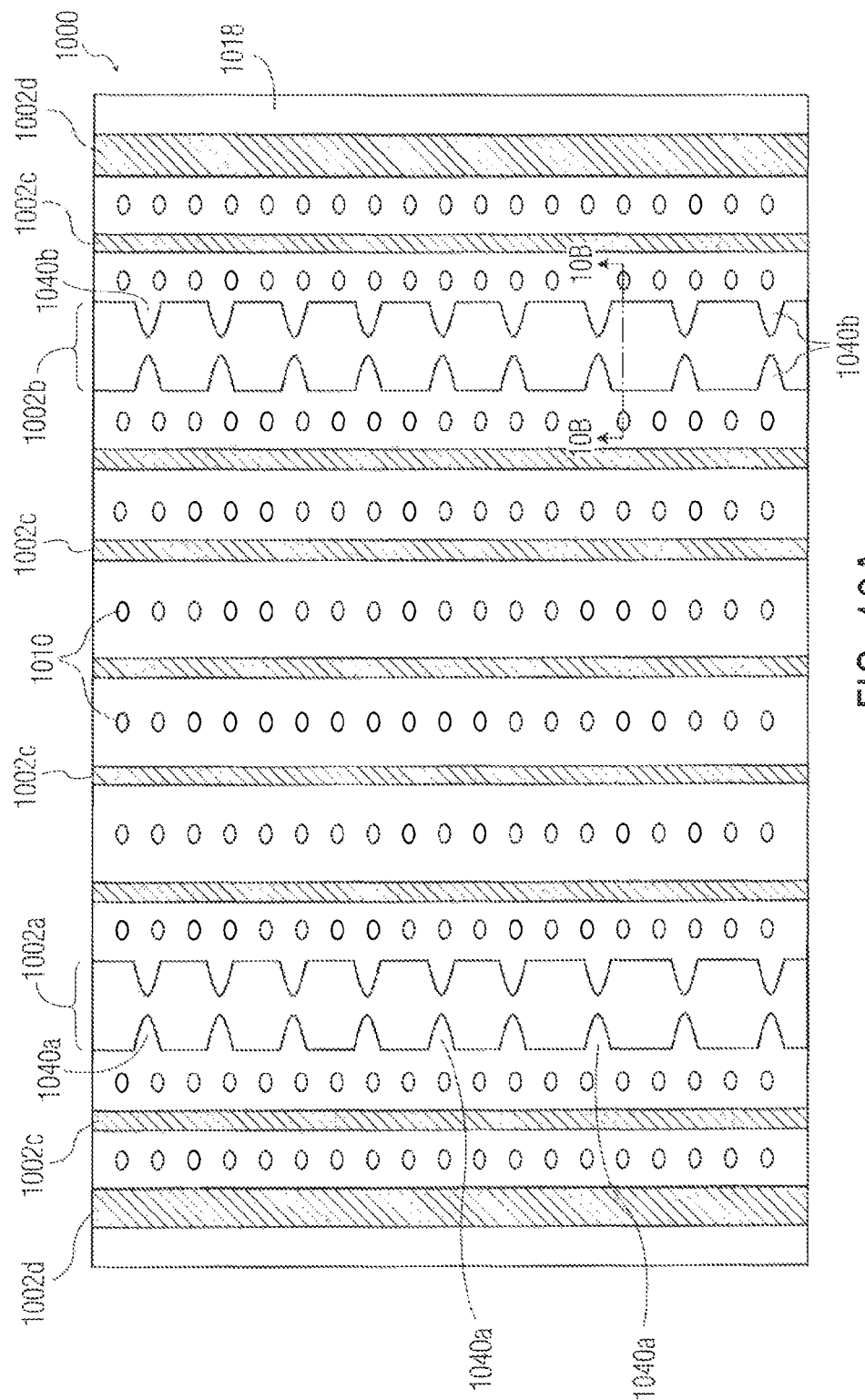
FIGS. 10A-10B are, respectively, a plan, top down view, and a side block diagram view of FIG. 10A taken along line 10B-10B, of yet another alternate workholder structure for bonding a workpiece in accordance with an exemplary embodiment of the present invention.
Figure 10B:
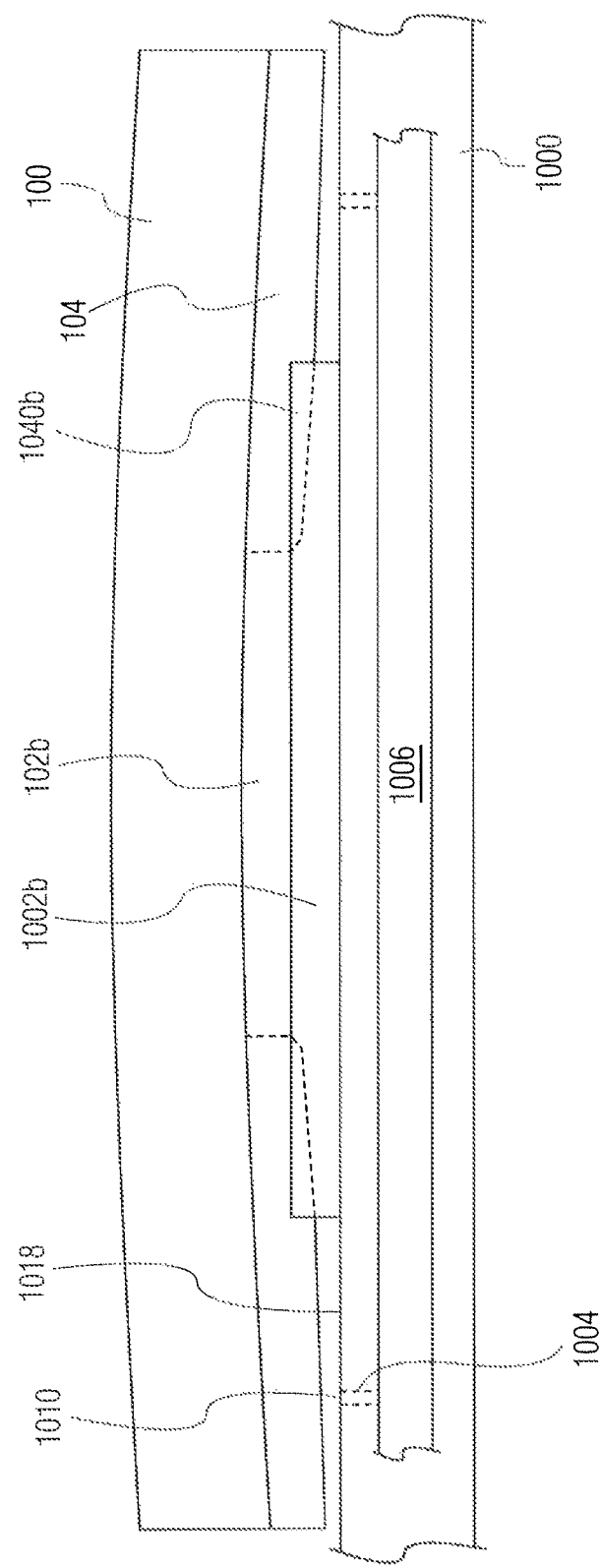

FIGS. 10A-10B are, respectively, a plan, top down view, and a partial side view, of an exemplary workholder structure for bonding a substrate (e.g., bonding ribbon material to a back side of a solar substrate) in accordance with yet another exemplary embodiment of the present invention (with FIG. 10B being a partial cross section of FIG. 10A taken along line 10B-10B and with workpiece 100 (not shown in FIG. 10A) in position for bonding). As illustrated in FIGS. 10A-10B, workholder 1000 is configured to support a front side of a solar substrate (e.g., front side of solar substrate 100 illustrated in FIG. 1) during a bonding operation on the back side of solar substrate 100. Such a bonding operation may include bonding one or more lengths of conductive ribbon material to the back side of solar substrate 100. Workholder 1000 defines first plurality of primary standoffs 1002a, 1002b extending above upper surface 1018 of workholder 1000, spaced and sized to contact respective busbars 102a, 102b during a bonding operation. It may be desirable that primary standoffs 1002a, 1002b have a width that exceeds the width of busbars 102*a*, 102*b*. In certain solar substrates, the height of the current fingers may exceed the height of the busbars. In such applications, if the width of primary standoffs exceeds the width of the busbars 102*a*, 102*b*, damage may result to the solar substrate because of contact between the current fingers and the primary standoffs. In order to address such concerns, primary standoffs 1002*a*, 1002*b* define respective recesses 1040*a*, 1040*b* sized and spaced to accommodate at least a portion of respective current fingers 104 (where current fingers 104 may be considered to be a conductive region 104) of solar substrate 100 proximate respective busbars 102*a*, 102*b* (e.g., see FIGS. 1A-1B). It is contemplated that recesses 1040*a*, 1040*b*, for example, may also accommodate other structures having a height greater than busbars 102*a*, 102*b* that may, or may not be, electrically conductive. As illustrated in FIG. 10A, secondary standoffs 1002*c*, 1002*d* are arranged substantially parallel to primary standoffs 1002*a*, 1002*b*, and the width of secondary stand-off 1002*d* is greater than the width of secondary stand-off 1002*c* (although it is contemplated to have other width to width ratios of secondary standoffs 1002*c*, 1002*d*). Through-holes 1010 are arranged in rows between ones of standoffs 1002*c*, 1002*d*.

FIG. 10B illustrates solar substrate 100 including current fingers 104 intersecting busbar 102*b*. Primary standoff 1002*b* contacts busbar 102*b* and portions of current fingers 104 adjacent busbar 102*b* are received within respective recesses 1040*b* of primary standoff 1002*b*. Through-holes 1010 adjacent primary standoff 1002*b* communicate with chamber 1006 through respective channels 1004. Chamber 1006, within workholder 1000, in turn communicates with a fluid pump via a valved connection (not shown).

According to certain exemplary embodiments of the present invention, the heights of the various standoffs disclosed herein are selected to be as small as possible, for example, because it may assist in minimizing bending of the cell (e.g., in configurations such as in FIGS. 3-4 without secondary standoffs). If the height of the current fingers is higher than the height of the busbars, the height of the primary standoffs is desirably larger than that height difference. For example, the nominal height of primary standoffs is desirably at least the height difference between current fingers and busbars plus a manufacturing tolerance. Further, the nominal height may be chosen to be even slightly higher, but not so high to cause such a high gap between the workpiece and the workholder surface that a fluid leakage is too large that the pump can not adequately pull down workpiece 100 in the step between FIG. 3B and FIG. 3C. For example, a maximum height between a workpiece and the workholder may be approximately 0.250 mm, and in such a case, the maximum height of the primary standoffs shall be 0.250 mm. The height difference between busbars and current fingers is typically less than 0.050 mm. With a reasonably large/loose manufacturing tolerance of +/−0.025 mm, the minimum nominal height of the primary standoffs is 0.050 mm, and more often 0.075 mm. Primary standoffs even higher than a minimum height of 0.075 mm may be desirable, for example, if the primary standoffs are not an integral part of the workholder base, but instead specific inserts, for example, from another material with properties that specially suit the function to support the workpiece under the bond locations.

A function of secondary standoffs is to minimize the workpiece bending for a given height of the primary standoffs. The desirability of secondary standoffs therefore increases with an increasing height of the primary standoffs, and with an increasing need to keep the workpiece as flat as possible. In most cases, the secondary standoffs may not be higher than the primary standoffs, particularly if the current fingers are higher than the busbars, and even if the current fingers and the busbars have identical heights. In an example, to ensure a lower height of the secondary standoffs compared to the primary standoffs, their nominal height may be the nominal height of the primary standoffs minus 2 times the manufacturing tolerance of the primary standoffs.

In most cases, the width of the primary standoffs is at least partly dictated by the width of the busbars (e.g., but not necessarily, as in designs such as that illustrated in FIG. 10). The width of the primary standoffs may be significantly larger than the width of the busbars. Typical busbars are between 1.50 mm and 2.50 mm wide. The width of the secondary standoffs is not necessarily limited by the dimensions of the workpiece. If the through-holes are selected to go through the secondary standoffs, the width of the secondary standoffs may be selected to be small to reduce the total contact area between the workpiece and the workholder, so as to reduce the risk of cracking the workpiece by any debris between the workpiece and the workholder. An exemplary width may be the diameter of the through-hole plus 0.50 mm to 1.00 mm on each side, i.e., 3.00-4.00 mm. The diameter of the through-hole may be selected to be small enough such that the workpiece is not 'pulled into the through-hole' and potentially cracked. This maximum width of the secondary standoffs may depend on the workpiece thickness. For a workpiece thickness of 160 microns, a 2 mm hole diameter works well, and a maximum hole diameter may be approximately 3 mm. If the through-holes are chosen to be positioned between the secondary standoffs, the width of the standoffs and/or their number may be chosen to keep the gap between the secondary standoffs narrow enough to not allow the workpiece to be bent too much.

While simple parallel standoffs as shown in FIG. 2 and FIG. 10 are exemplary configurations, standoff pins, instead of 'bars', that form something like a chess board structure are also contemplated. This may further reduce the contact area between workpiece and workholder, and so may reduce the risk to break the cell along a standoff.

For each of the workholders described herein, it is contemplated that the (primary) standoffs (configured to contact and support the busbars of the solar substrate) and/or secondary standoffs may be continuous structures extending the length of the workholder (as illustrated in connection with standoffs 202*a*, 202*b* in FIG. 2), or may be comprised of one or more segments as the application dictates. The primary and/or secondary standoffs disclosed herein may be integral with the respective workholder, or they may be separate structures affixed to a body portion of the workholder. If the standoffs are separate structures they may be of the same material, or a different material, as the surface material of the workholder. Exemplary materials for the primary standoffs include (1) harder materials such as, for example, tungsten carbide, steel, ceramic, etc., (2) softer materials that may dampen more than harder materials during the ultrasonic bonding operation such as, for example, aluminum (ribbon), Kapton® polyimide film (a registered trademark of E.I du Pont de Nemours and Company), etc., and (3) a softer, dampening, material coated with a harder material for increased wear resistance, for example, aluminum (ribbon) with a top coat of a harder material such as hard chrome, hard anodization, or a composite ceramic that is sprayed onto the aluminum in a water solution and then sintered, amongst others. Additional exemplary materials for the secondary standoffs may be comprised of (1) a compliant material, for example, rubber, urethane, plastic, Delrin® plastic material, and Teflon® material (each registered trademarks of E.I du Pont de Nemours and Company), and (2) such compliant material coated with a harder material for increased (or decreased) wear resistance, for example, a sputtered silicon carbide layer.

The various workholders shown in FIGS. 2, 3A-3F, 4-9, and 10A-10B may be used in connection with various types of workpieces. While not limited thereto, these workholders have primarily been described in connection with the bonding of back sides of solar substrates. Likewise, while not limited thereto, FIGS. 12, 13A-13F, and 14-18 will be described in connection with the bonding of front sides of solar substrates. Further still, FIGS. 12, 13A-13F, and 14-18 will be primarily described in connection with the bonding of front sides of solar substrates, when the back sides of the solar substrates have previously been bonded with a conductive ribbon material.

Figure 11A:
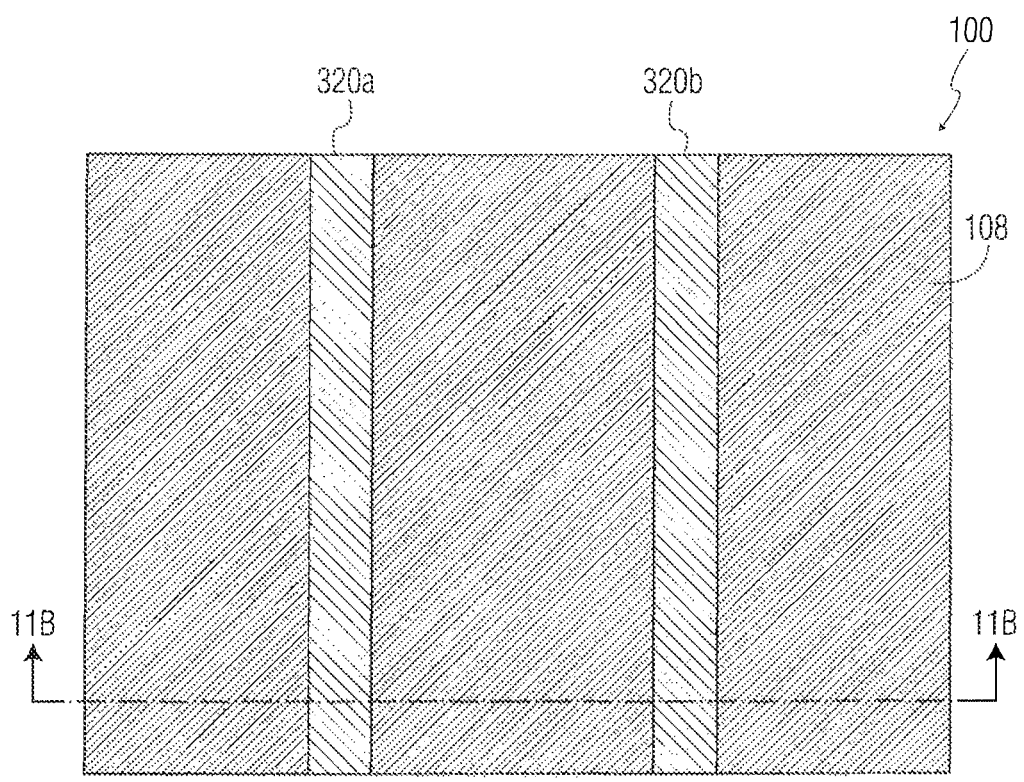
FIG. 11A is a plan, overhead view of a workpiece for bonding in accordance with an exemplary embodiment of the present invention.
Figure 11B:
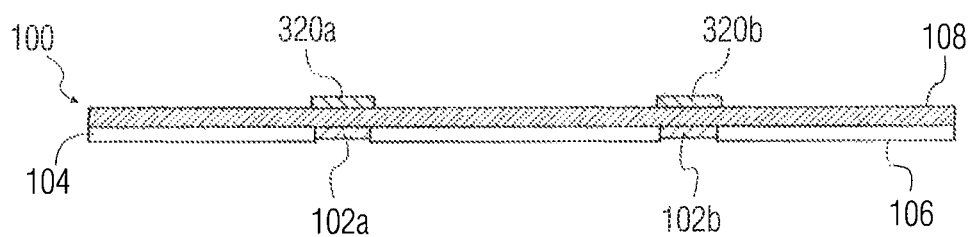
FIG. 11B is a cut away view of FIG. 11A taken along line 11B-11B.
Figure 12:
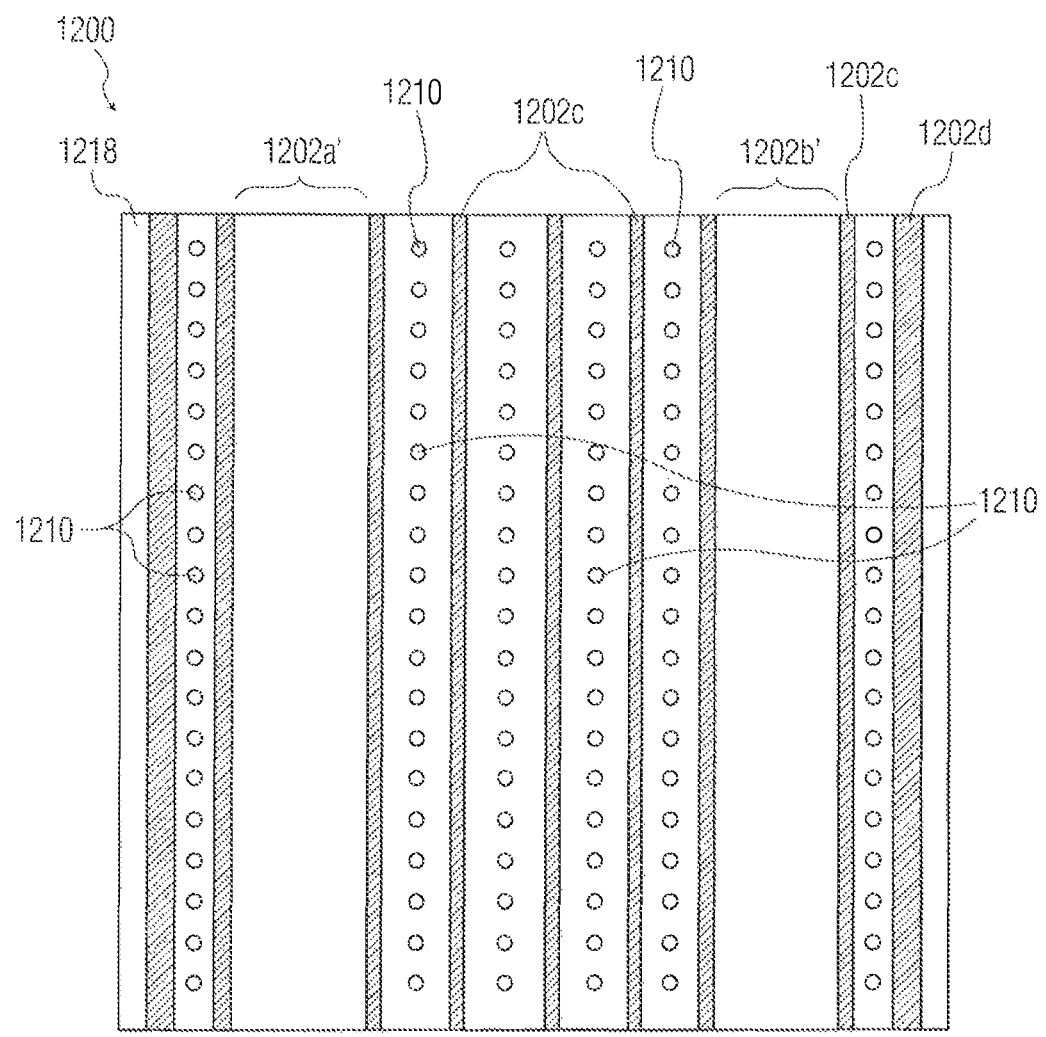
FIG. 12 is a plan, overhead view of a workholder for bonding of a workpiece in accordance with an exemplary embodiment of the present invention.

FIG. 11A is a plan, overhead view of backside 108 of workpiece 100 (e.g., a solar cell/substrate) in accordance with an exemplary embodiment of the present invention. Backside 108 of solar cell 100 includes back side ribbons 320a, 320b (e.g., ribbons 320a, 320b bonded in a manner shown in FIGS. 3A-3F). FIG. 11B is a cut-away view of workpiece 100 taken along line 11B-11B, and illustrating a position of ribbons 320a, 320b above busbars 102a, 102b, with current fingers 104 extending from, and between, busbars 102a, 102b. According to certain exemplary embodiments of the present invention, following the bonding of ribbons on a back side of a solar substrate, front side 106 of the workpiece is to be bonded (e.g., ribbon bonded). FIG. 12 illustrates exemplary workholder 1200 for supporting a solar substrate during bonding of the front side of the solar substrate (e.g., solar substrate 100 of FIGS. 1A-1B).

More specifically, workholder 1200 in FIG. 12 is configured to support the back side of a solar substrate (e.g., backside 108 of solar substrate 100 illustrated in FIG. 11) during a bonding operation on the front side of solar substrate 100 (e.g., see FIGS. 13A-13F, and 14-18 discussed below). During a bonding operation conductive ribbon material, for example, is bonded to one or more conductive regions of front side 106 of solar substrate 100 (e.g., see FIG. 1). More specifically, the ribbon material is bonded to busbars 102a, 102b on frontside 106 of solar substrate 100 (e.g., see FIGS. 13D-13E below). Workholder 1200 defines flat areas 1202a', 1202b', and standoffs 1202c, 1202d on upper surface 1218. Outboard standoffs 1202d may (or may not) have a width greater than a width of standoffs 1202c as is illustrated, and vice-versa. Areas 1202a', 1202b' may be sized and spaced to contact respective bonded back side ribbons 320a, 320b during the front side bonding operation and their number and placement may correspond to the number and placement of bonded backside ribbons 320a, 320b. In effect, bonded backside ribbons 320a, 320b may act as standoffs (e.g., primary standoffs) for solar substrate 100 during frontside bonding. Standoffs 1202c, 1202d are arranged, in the illustrated embodiment, substantially parallel to, areas 1202a', 1202b'. Other configurations of standoffs 1202c, 1202d are contemplated (e.g., segmented standoffs, etc.). Through-holes 1210 are arranged in rows between ones of standoffs 1202c, 1202d. In the illustrated embodiment, no through-holes are provided directly adjacent to, or within, areas 1202a', 1202b' (i.e., there is a standoff between each of areas 1202a', 1202b' and the closest row of through-holes). Other configurations of through-holes 1210 are contemplated. Even if the through-holes are positioned relatively far away from the bond locations, those holes may provide good anchoring/clamping of the workpiece at the bond locations, if the workpiece is sufficiently flat as enabled by the secondary standoffs, which makes the workpiece, despite being very thin, stiff in its plane and may tend to prevent it from buckling.

Figure 13A:
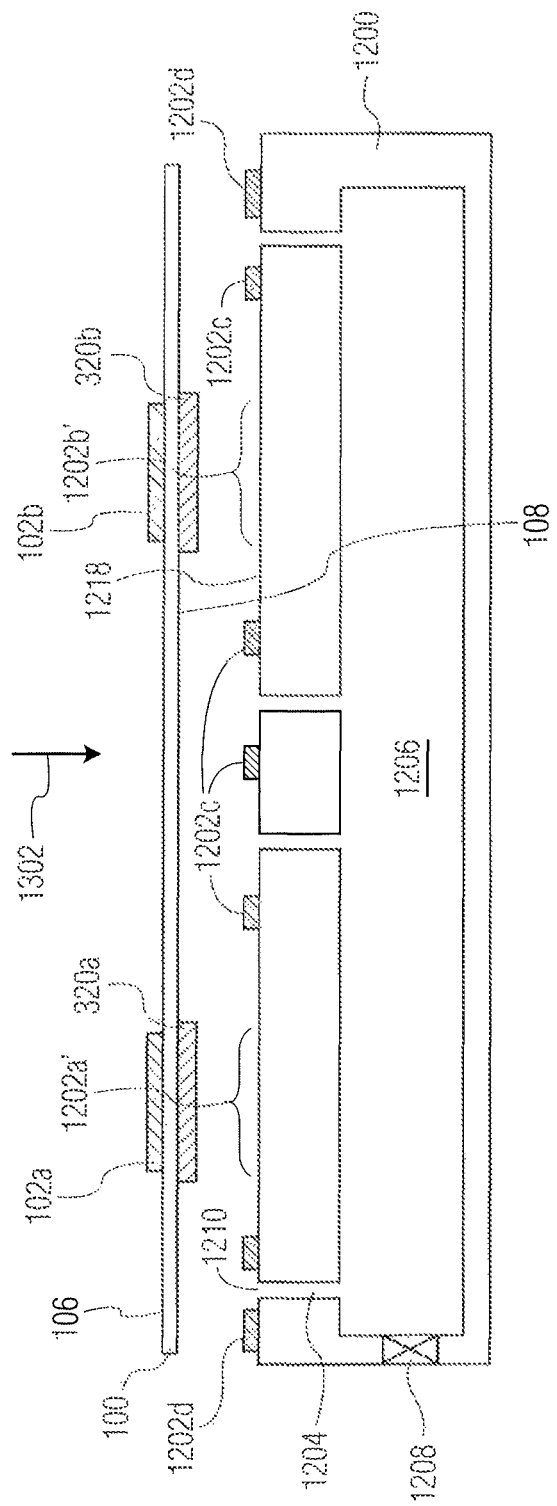
FIGS. 13A-13F are a series of side cut away views of bonding of a workpiece in accordance with an exemplary embodiment of the present invention.

FIGS. 13A-13F are a series of side cut away views illustrating a ribbon bonding operation on a workpiece in accordance with an exemplary embodiment of the present invention. Exemplary workholder 1200 is substantially similar to that illustrated in FIG. 12 (although only 2 through-holes 1210 are illustrated between standoffs 1202c for simplicity). In this example, workpiece 100 is solar substrate 100 (e.g., crystalline silicon solar substrate 100) including busbars 102a, 102b on its frontside 106 (e.g., as illustrated and described with respect to FIG. 1). In FIG. 13A, solar substrate 100 is positioned over upper surface 1218 of workholder 1200 with bonded back side ribbons 320a, 320b aligned with a respective pair of flat areas 1202a', 1202b', where substrate 100 is moved downward, as at arrow 1302 (see below). Solar substrate 100 also includes current fingers (not shown but see, e.g., current fingers 104 of FIGS. 1A-1B, and 11B) extending between, and outward from, busbars 102a, 102b.

Workpiece 100 is desirably accurately placed onto workholder 1200 before a bonding operation, particularly in the direction perpendicular to back side ribbons 320a, 320b. However, the position of back side ribbons 320a, 320b relative to an edge of workpiece 100 may vary significantly (e.g., with position variation up to +/−1.0 mm). In such a case placement of workpiece 100 relative to its edge is not sufficient, and placement based on pattern recognition on back side bonded ribbon 320a, 320b structure may be desirably utilized. Pattern recognition can be performed during cell placement, for example, with (1) a camera in or looking through workholder 1200, (2) a look up-down camera that is moved in between workholder 1200 and workpiece 100, or (3) a calibrated camera off workholder 1200 to measure the workpiece's front side structure before workpiece placement to make appropriate position adjustments during workpiece placement, amongst other techniques.

Workholder 1200 includes stand-offs 1202c, 1202d spaced about elongated flat areas 1202a', 1202b', with stand-offs 1202d proximate the edges of workholder 1200. Workholder 1200 further includes channels 1204 connecting respective through-holes 1210 to chamber 1206. Such channels 1204/through-holes 1210 are between ones of center stand-offs 1202c, and between stand-offs 1202d and adjacent stand-offs 1202c. Chamber 1206 in turn is in communication with a negative fluid drawing source (e.g., a fluid pump, not shown, similar in certain respects to a vacuum source) by valve 1208 configured to be open to draw fluid through through-holes 1210, or closed (as illustrated by the "X" in FIG. 13A). The fluid pump is configured to withdraw fluid (ambient atmosphere/air) from chamber 1206 as will be discussed in greater detail below.

Figure 13B:
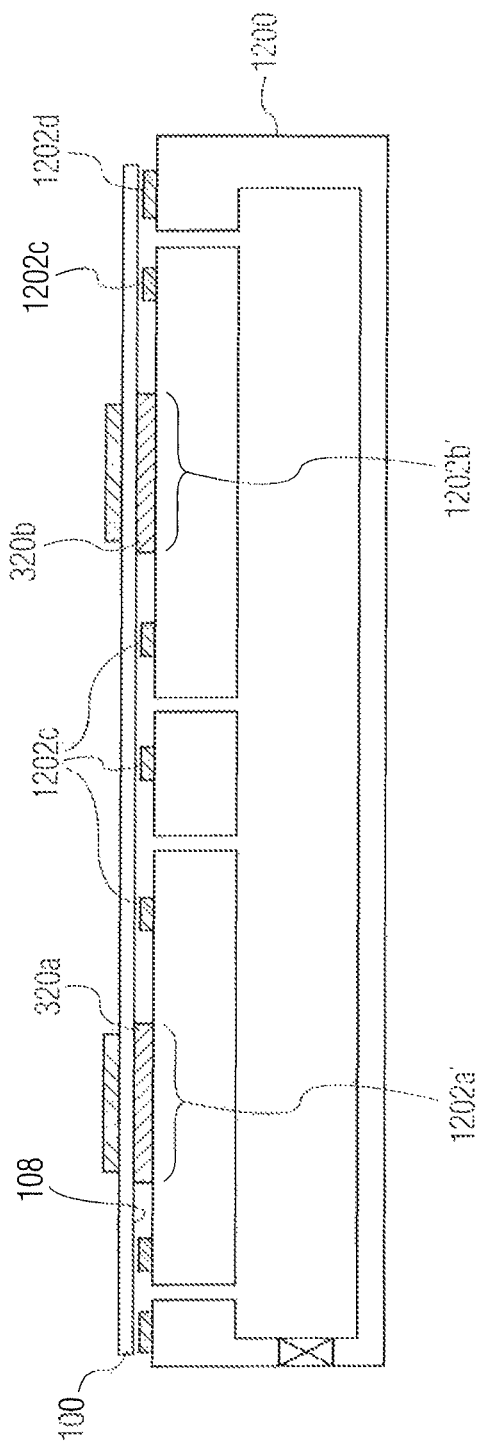
Figure 13C:
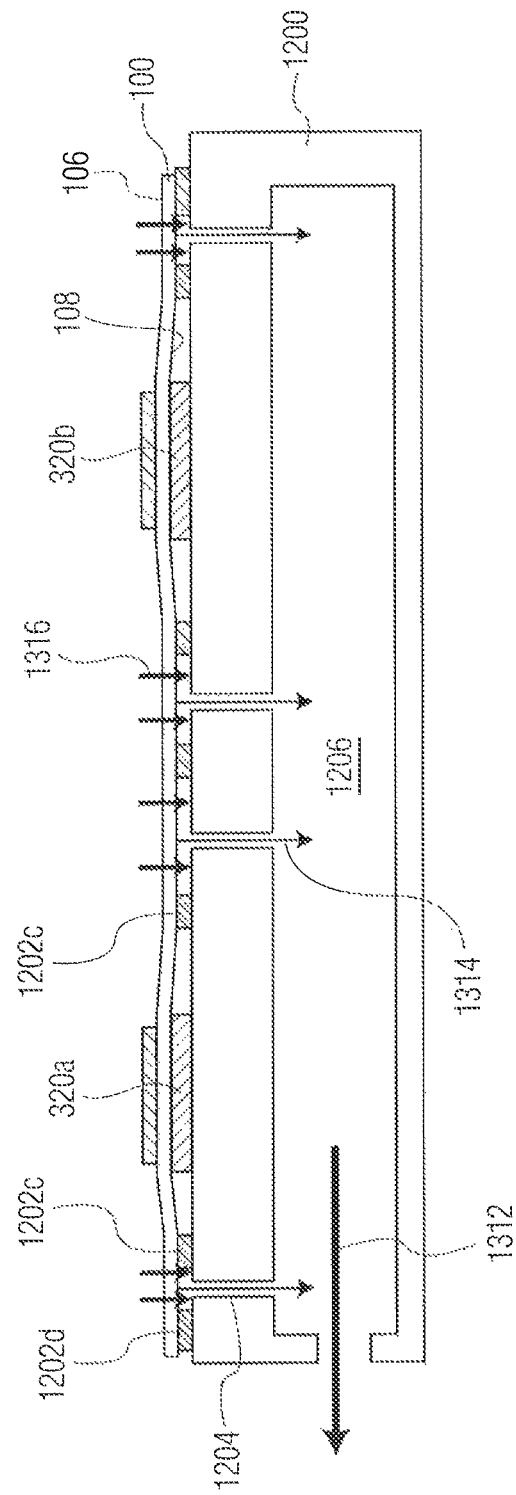

In FIG. 13B, solar substrate 100 has been lowered such that each bonded back side ribbon 320a, 320b contacts flat areas 1202a', 1202b', and areas of back side 108 over respective (1) stand-offs 1202c positioned between flat areas 1202a', 1202b', and (2) stand-offs 1202c, 1202d outboard of flat areas 1202a', 1202b'. FIG. 13C illustrates activation of the fluid pump (not shown) to withdraw fluid (e.g., ambient atmosphere/air as at arrow 1312) from chamber 1206 to create a negative fluid pressure through the plurality of through-holes 1210 via channels 1204, as at arrows 1314. This provides downward pulling force, as at arrows 1316, on workpiece/solar substrate 100 which secures solar substrate 100 to workholder 1200 during a bonding process, and may cause bending of solar substrate 100 as illustrated. Portions of back side 108 now contact respective (1) stand-offs 1202c positioned between flat areas 1202a', 1202b', and (2) stand-offs 1202c, 1202d outboard of flat areas 1202a', 1202b'. The bending of substrate 100 may be exaggerated in FIG. 13C (and in FIGS. 13D-13E) for illustration of the downward pulling force as it is understood that it is generally undesirable to bend a solar substrate.

The amount of downward pulling force 1316 is related to the withdrawal pressure 1312 exerted by the fluid pump and the size and arrangement of through-holes 1210/channels 1204. Various factors, such as the spacing and diameter of through-holes 1210, and the height and spacing of standoffs 1202c, 1202d may affect the amount of bending of solar substrate 100. Generally, the less the bending of solar substrate 100 the better in order to minimize potential cracking of solar substrate 100 during retention of substrate 100 to workholder 1200, and during the bonding of conductive material to front side 106 of substrate 100. A bond head assembly (not shown, but see, e.g., FIG. 3D) with a first conductive material/conductive frontside ribbon (material) 1320a, is then brought over solar substrate 100 so as to overlie busbar 102a (effectively supported by first backside ribbon 320a).

Figure 13D:
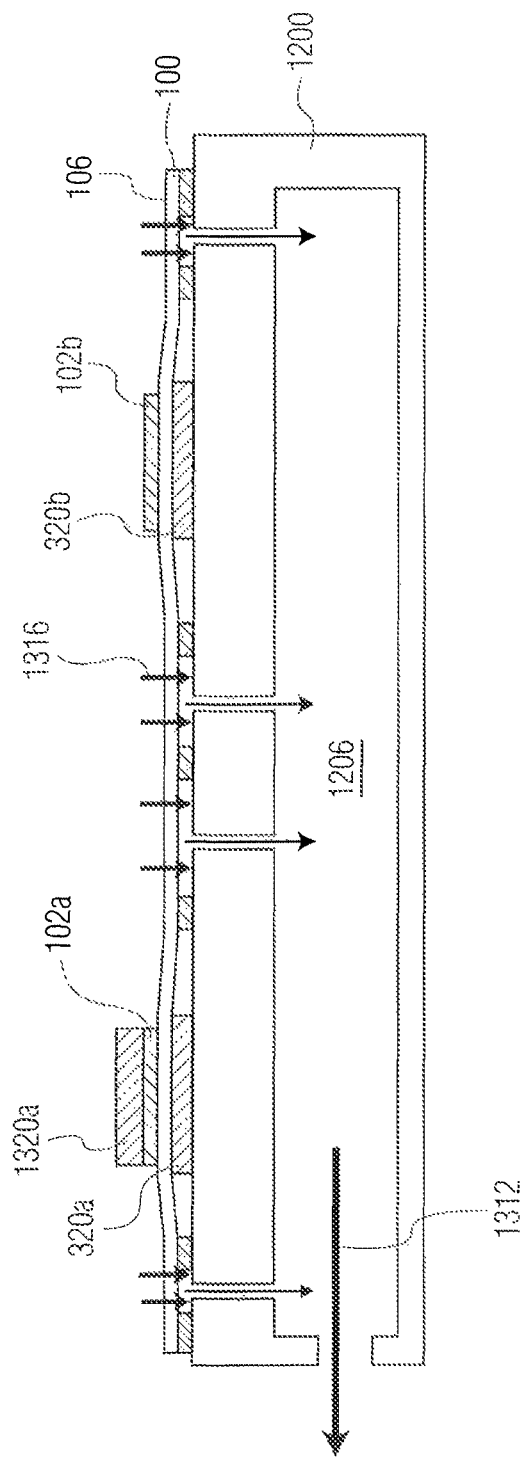

FIG. 13D illustrates the bonding of first front side ribbon 1320a onto busbar 102a on front side 106 of solar substrate 100 opposite to, and effectively supported by, first back side ribbon 320a. That is, ribbon 1320a is ultrasonically bonded to a conductive region (busbar 102a) of solar substrate 100, with the length of ribbon 1320a being positioned over busbar 102a for such ultrasonic bonding. The withdrawal of air, as at arrow 1312, by a fluid pump maintains downward pulling force 1316 on solar substrate 100 so that substrate 100 is secured to workholder 1200 to permit efficient and effective bonding of first frontside ribbon 1320a to busbar 102a. It is noted that exemplary details and operation of the bond head assembly may be analogous to those shown and described in FIG. 3D.

Figure 13E:
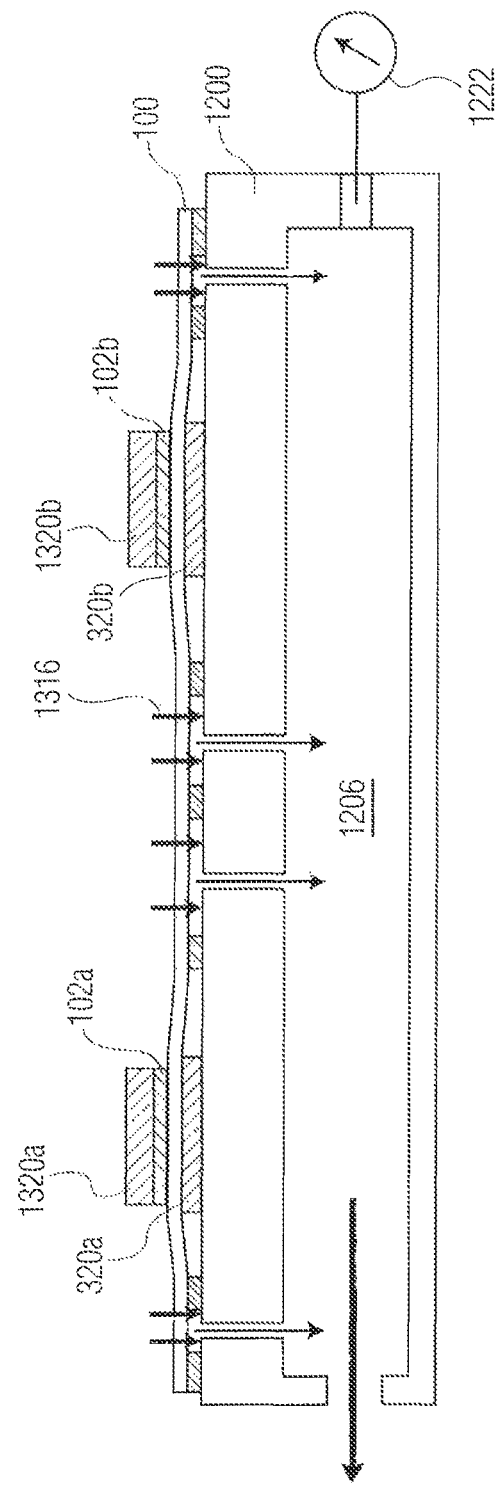
Figure 13F:
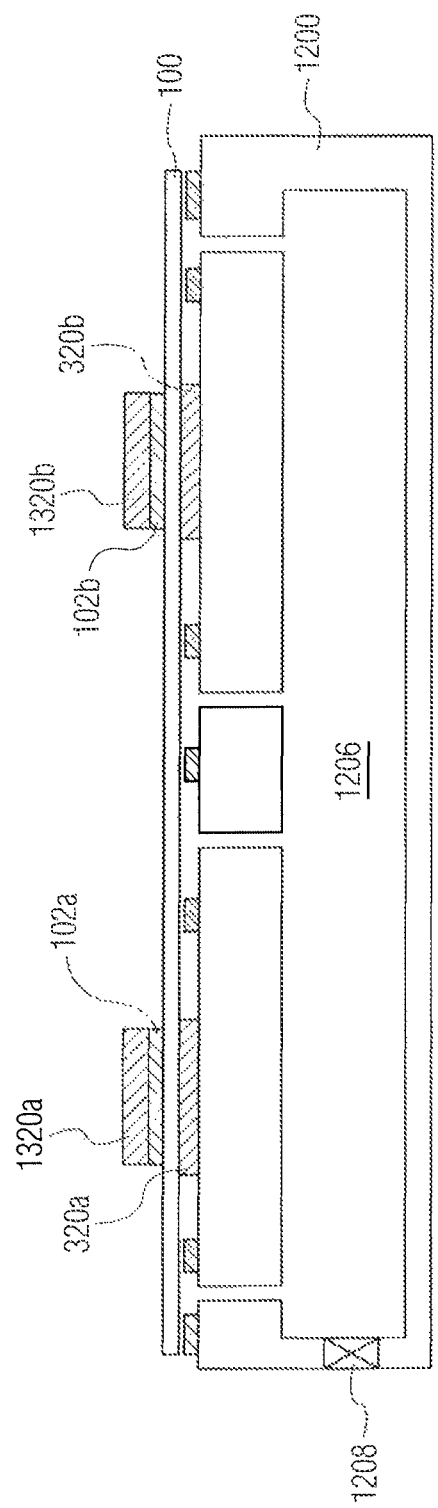

FIG. 13E illustrates first front side ribbon 1320a and second front side ribbon 1320b bonded to respective busbars 102a, 102b on solar substrate 100 opposite to (and effectively supported by during bonding) respective first and second back side ribbons 320a, 320b with downward force 1316 still applied to substrate 100. Gauge 1222 may be used to establish the amount of negative fluid pressure within chamber 1206. It is noted that the individual bonds for first and/or second front side ribbons 1320a, 1320b may be formed as desired, for example, substantially opposite the individual bonds of first and/or second back side ribbons 320a, 320b, or between the bonds of first and/or second back side ribbons 320a, 320b. FIG. 13F illustrates first front side ribbon 1320a and second front side ribbon 1320b bonded to respective busbars 102a, 102b (with busbars 102a, 102b on the front side of substrate 100 opposing respective bonded back side ribbons 320a, 320b) and valve 1208 now closed (as indicated by the "X"). Thus, the downward force is eliminated and solar substrate 100 returns to a substantially flat profile as illustrated. The now bonded solar substrate 100 (with front side ribbons 1320a, 1320b now bonded onto busbars 102a, 102b) may then be available for further processing as the application requires.

Figure 14:
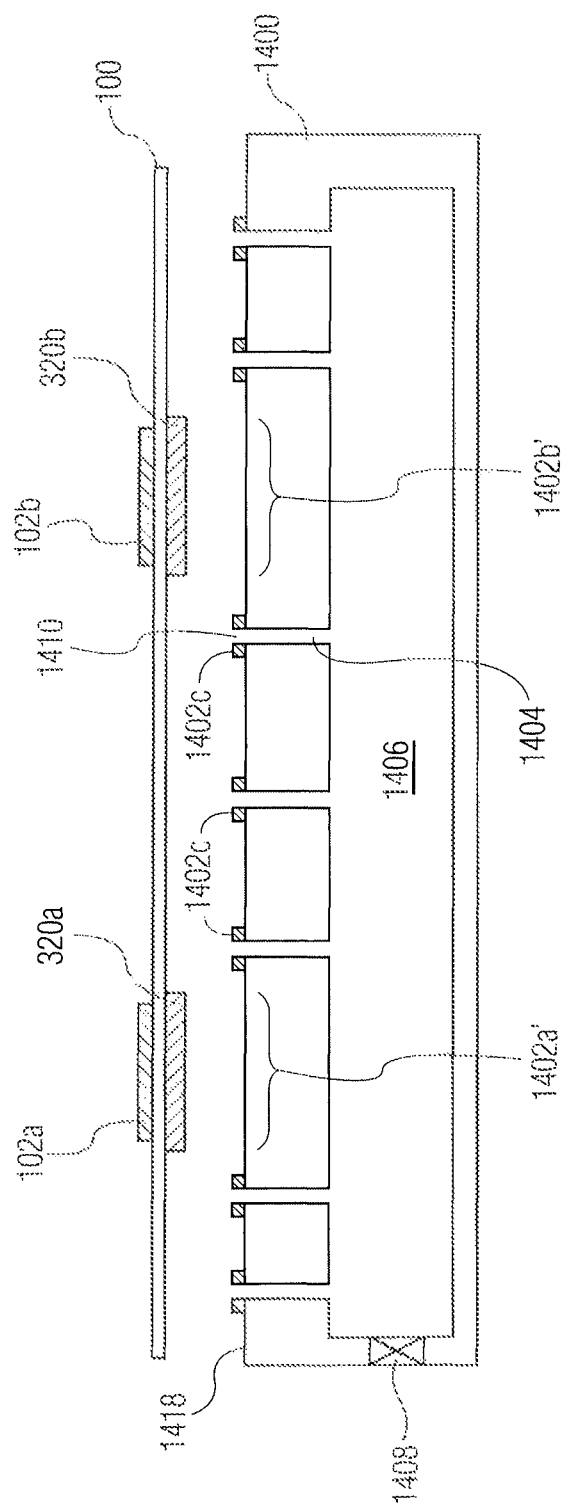
FIGS. 14-18 are side cut away views of workholder structures for use in bonding of a workpiece in accordance with various exemplary embodiments of the present invention.

FIG. 14 illustrates solar substrate 100 positioned over exemplary workholder 1400 with pair of bonded back side ribbons 320a, 320b aligned with respective elongated flat areas 1402a', 1402b' on upper surface 1418. Busbars 102a, 102b on the front side of substrate 100 oppose respective bonded back side ribbons 320a, 320b. Standoffs 1402c extend from upper surface 1418 of workholder 1400 (standoffs 1402c extending along the length of workholder 1400 parallel to elongated flat areas 1402a', 1402b'). Standoffs 1402c have a height (thickness) that is less than the amount of height (thickness) of bonded backside ribbons 320a, 320b from upper surface 1418 of workpiece 100. Channels 1404 extend from through-holes 1410 at the top surface of standoffs 1402c to chamber 1406 which in turn is connected to a fluid pump (not shown), where fluid/air is withdrawn through channels 1404/through-holes 1410 when valve 1408 is opened.

Figure 15:
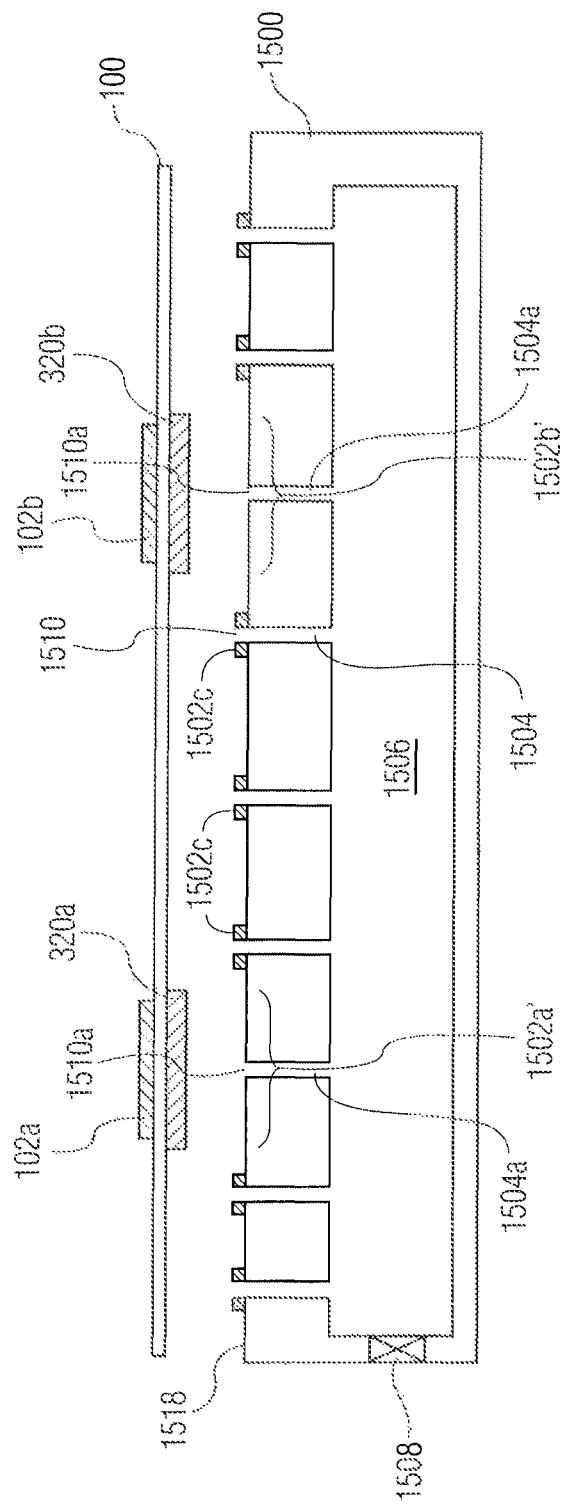

FIG. 15 illustrates solar substrate 100 positioned over exemplary workholder 1500 with pair of bonded backside ribbons 320a, 320b aligned with respective elongated flat areas 1502a', 1502b' on upper surface 1518. Busbars 102a, 102b on the front side of substrate 100 oppose respective bonded back side ribbons 320a, 320b. Standoffs 1502c extend from upper surface 1518 of workholder 1500 (standoffs 1502c extending along the length of workholder 1500 parallel to elongated flat areas 1502a', 1502b'). Standoffs 1502c have a height (thickness) that is less than the amount of height (thickness) of bonded backside ribbons 320a, 320b from the surface of workpiece 100. Channels 1504 extend from through-holes 1510 at the top surface of standoffs 1502c to chamber 1506 which in turn is connected to a fluid pump (not shown), where fluid/air is withdrawn through channels 1504/through-holes 1510 when valve 1508 is opened. Thus, the structure illustrated in FIG. 15 may be similar to the structure illustrated in FIG. 14, except that additional through channels 1504a extend from through-holes 1510a at surface 1518 of workholder 1500, and are positioned approximately at the center line of elongated flat areas 1502a', 1502b', and fluid/air is withdrawn through channels 1504a/through-holes 1510a when valve 1508 is opened. Thus, exposed lower surfaces of bonded back side ribbons 320a, 320b contact through-holes 1510a when substrate 100 is moved to contact workholder 1500. It is contemplated that through-holes 1510a/channels 1504a may be off set from the center line of elongated flat areas 1502a', 1502b', and that there may be multiple such plurality of through-holes/channels along/about such center line within the elongated flat areas.

Figure 16:
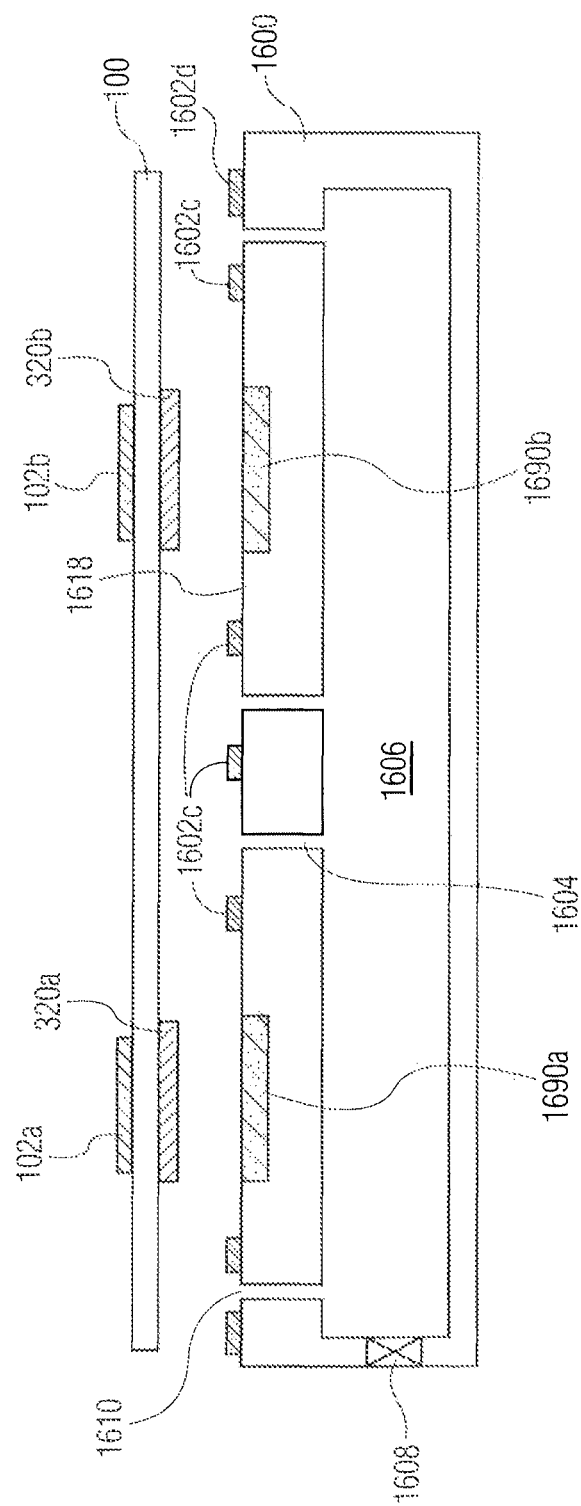

FIG. 16 is a side view of an alternate embodiment workholder structure for bonding of a workpiece. Solar substrate 100 is positioned over back side exemplary workholder 1600 with pair of bonded back side ribbons 320a, 320b aligned with, and facing, respective pair of inserts 1690a, 1690b of workholder 1600. Busbars 102a, 102b on the front side of substrate 100 oppose respective bonded back side ribbons 320a, 320b. The upper surfaces of inserts 1690a, 1690b are each flush with upper surface 1618 of workholder 1600. Inserts are inserted (and attached/secured) into respective recesses of surface 1610. Inserts 1690a, 1690b may be comprised of, for example, ceramic. Standoffs 1602c, 1602d extend from upper surface 1618 of workholder 1600, and may be arranged substantially parallel to inserts 1690a, 1690b. Standoffs 1602d proximate the opposing side edges of solar substrate 100 have a width greater than the width of standoffs 1602c. Channels 1604 extend to chamber 1606 from through-holes 1610 at the upper surface 1618 of front side workholder 1600 to an opposing surface of workholder 1600. Chamber 1606 is connected to a negative fluid withdrawal source, for example, a fluid withdrawal pump (not shown) through valve 1608 (shown closed), to create a negative fluid pressure.

Figure 17:
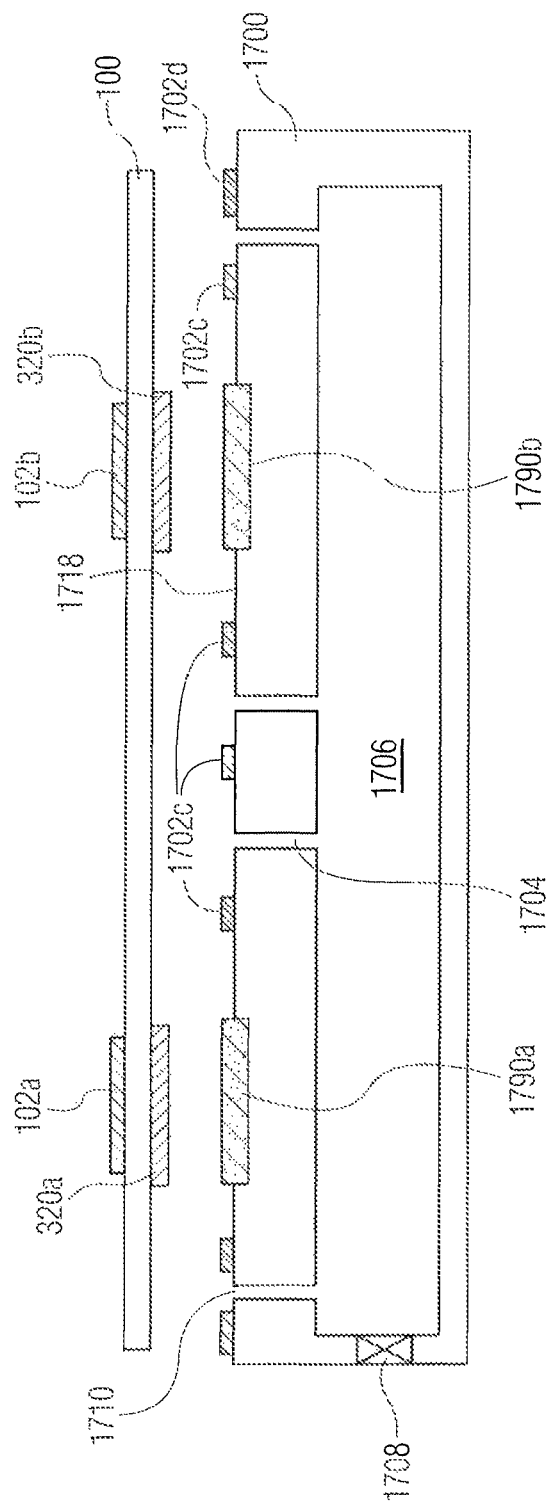

FIG. 17 is a side view of another alternate embodiment workholder structure for bonding of a substrate. In this exemplary embodiment (as compared to the embodiment illustrated in FIG. 16) pair of inserts 1790a, 1790b protrude above (and as such are not flush with) surface 1718 of workholder 1700. Solar substrate 100 is positioned over exemplary workholder 1700 with pair of bonded back side ribbons 320a, 320b aligned with, and facing, respective pair of inserts

1790a, 1790b. Busbars 102a, 102b on the front side of substrate 100 oppose respective bonded backside ribbons 320a, 320b. The upper surfaces of inserts 1790a, 1790b may each protrude from upper surface 1718 of front side workholder 1700 by from about 0.025 mm to 0.250 mm, and from about 0.050 mm to 0.100 mm. Standoffs 1702c, 1702d extend from upper surface 1718, and may be arranged substantially parallel to protruding inserts 1790a, 1790b. Channels 1704 extend from through-holes 1710, at upper surface 1718 of front side workholder 1700 to an opposing surface of workholder 1700, and open into chamber 1706 which, in turn, is connected to a negative fluid withdrawal source, for example, a fluid withdrawal pump (not shown) through valve 1708 (shown closed), to create a negative fluid pressure. Inserts 1790a and 1790b may consist of one or multiple pieces.

Figure 18:
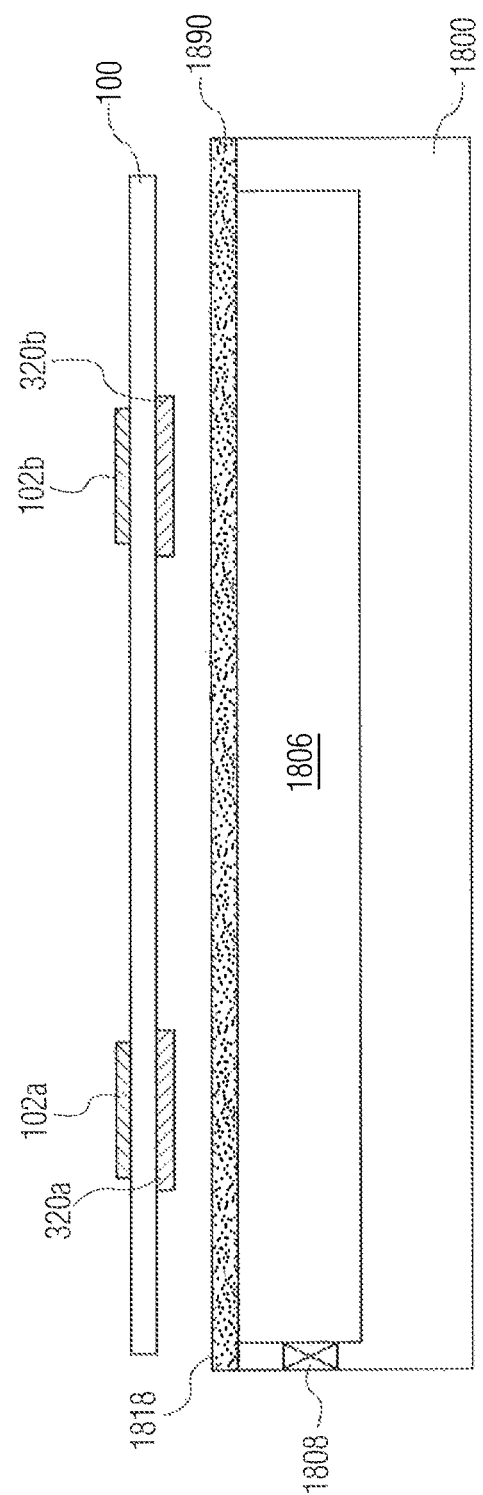

FIG. 18 is a side view of yet another alternate embodiment workholder structure for bonding of a substrate. Solar substrate 100 is positioned over exemplary workholder 1800, with pair of bonded back side ribbons 320a, 320b facing front side workholder 1800. Busbars 102a, 102b on the front side of substrate 100 oppose respective bonded back side ribbons 320a, 320b. Porous material layer 1890 is included as an upper portion of workholder 1800, and is in fluid communication with chamber 1806. Porous layer 1890 permits flow of fluid/air there through at least in a vertical direction, and may be compressible. Upper surface 1818 of workholder 1800 is thus the upper surface of porous material layer 1890. Chamber 1806 is connected to a negative fluid withdrawal source, for example, a fluid withdrawal pump (not shown), through valve 1808 (shown closed) and is configured to allow withdrawal of air by the fluid withdrawal pump and through porous material layer 1890 to create a negative fluid pressure. Substrate 100 is lowered and pair of bonded back side ribbons 320a, 320b contact porous layer 1890, and the negative fluid pressure may facilitate at least partial embedding of back side ribbons 320a, 320b into porous layer 1890, to facilitate bonding of respective front side ribbons (not shown) over busbars 102a, 102b. In such an arrangement, the bending of solar substrate 100 may be reduced, thus reducing the risk of cracking. Porous material layer 1890 may have a thickness of from about 2.00 mm to 20.00 mm, and from about 5.00 mm to 15.00 mm, and may be comprised of, for example, ceramic (alumina, zirconia, silica, aluminum nitride, silicon nitride, silicon carbide) or steel (sintered from a metal powder).

Similar to workholders 200, 400, 500, 600, 700, 800, 900, 1000, the standoffs included in workholders 1200, 1400, 1500, 1600, and 1700 may be continuous structures as illustrated or may be comprised of multiple pieces/segments as the application dictates. Likewise, exemplary materials, dimensions, and configurations (e.g., integral with the remainder of the workholder, separate and attached to the remainder of the workholder, different materials than the remainder of the workholder, etc.) of the standoffs of workholders 200, 400, 500, 600, 700, 800, 900, 1000, are also applicable as exemplary of the standoffs included in workholders 1200, 1400, 1500, 1600, and 1700.

Exemplary standoffs may be comprised of tungsten-carbide, steel, ceramic, etc., as bonding takes place over them and so wear resistance may be desirable. Other exemplary standoffs may be comprised of relatively softer materials such as aluminum, polyimide (e.g., Kapton® polyimide film). Further still, other exemplary standoffs may be comprised of a relatively soft material such as aluminum, polyimide, but with an upper layer or coating of a harder material, such as tungsten-carbide, steel, ceramic, etc., to achieve some dampening while increasing wear resistance. Further still, other exemplary standoffs may be comprised of a compliant material, for example, rubber or plastic, etc. (or may be comprised of a compliant material such as rubber or plastic, etc. with an upper layer/coating of a harder material to increase wear resistance such as tungsten-carbide, steel, ceramic, etc.). Further still, other exemplary standoffs may be comprised of a porous material that is compressible.

The through-holes of the present invention need not go all the way through, or completely penetrate, the workholder. For example, as illustrated in the present figures, the through-holes may extend from an upper surface of the workholder to a chamber (communicating with a fluid pump or the like) within the workholder (and/or from an upper surface of one or more standoffs). That is, the through-holes may extend from an upper surface of the workholder/standoff(s) to an opposing surface (e.g., the upper surface of the chamber) that is internal to the workholder. It is also contemplated that the through-holes may go all the way through the workholder to a chamber, or the like, below the workholder that is in communication with a fluid pump, or the like, of is part of a fluid pump or the like. Such a workholder may be, for example, a two part workholder where the through-holes extend fully through a first part of the workholder.

Although the present invention has been described primarily in terms of solar cell bonding applications (e.g., crystalline silicon solar cells, thin film solar cells, etc.), it is not limited thereto. The teachings of the present invention have application in any of a number of ultrasonic bonding applications (e.g., wire bonding) such as applications where wires or ribbons need to be attached to substrates which are either very large and thin, or just thin, and therefore of limited stiffness in their plane, or very flexible, or structured on the side opposite to the one where the wire or ribbon needs to be bonded to, or a combination of these properties.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. An ultrasonic ribbon bonding system comprising:
a workholder for supporting a workpiece during an ultrasonic ribbon bonding operation, the workholder defining a first plurality of standoffs extending above a surface of the workholder, the first plurality of standoffs configured to contact the workpiece during the ultrasonic ribbon bonding operation; and
a bond head assembly carrying a ribbon bonding tool, the ribbon bonding tool being configured to bond a ribbon to the workpiece during the ultrasonic ribbon bonding operation,
wherein the workholder defines a plurality of through-holes, and wherein respective ones of the plurality of through-holes are positioned between ones of the first plurality of standoffs.

2. The ultrasonic ribbon bonding system of claim 1 wherein the first plurality of standoffs are integral with the workholder.

3. The ultrasonic ribbon bonding system of claim 1 wherein the first plurality of standoffs are formed of a first material distinct from a material forming the surface of the workholder.

4. The ultrasonic ribbon bonding system of claim 1 wherein the first plurality of standoffs are comprised of tungsten-carbide, steel, or ceramic.

5. The ultrasonic ribbon bonding system of claim 1 wherein the first plurality of standoffs are comprised of aluminum or polyimide.

6. The ultrasonic ribbon bonding system of claim 1 wherein the workholder defines a second plurality of standoffs extending above the surface of the workholder, the second plurality of standoffs having a second height above the surface of the workholder that is less than a first height of the first plurality of standoffs above the surface of the workholder.

7. The ultrasonic ribbon bonding system of claim 6 wherein the second plurality of standoffs are comprised of a compliant material.

8. The ultrasonic ribbon bonding system of claim 6 wherein the second plurality of standoffs are comprised of at least one of rubber or plastic material.

9. The ultrasonic ribbon bonding system of claim 6 wherein a portion of the second plurality of standoffs have a third height that is less than the second height of others of the second plurality of standoffs.

10. The ultrasonic ribbon bonding system of claim 6 wherein a portion of the second plurality of standoffs has a width that is greater than a width of others of the second plurality of standoffs.

11. The ultrasonic ribbon bonding system of claim 6 wherein one or more of the second plurality of standoffs each includes a plurality of segments.

12. The ultrasonic ribbon bonding system of claim 1 wherein the workpiece is a solar substrate.

13. The ultrasonic ribbon bonding system of claim 12 wherein the solar substrate includes a plurality of busbars on a first side of the solar substrate.

14. The ultrasonic ribbon bonding system of claim 13 wherein the first plurality of standoffs contact the plurality of busbars during the ultrasonic ribbon bonding operation.

15. The ultrasonic ribbon bonding system of claim 13 wherein the first plurality of standoffs support the plurality of busbars during ultrasonic bonding of the ribbon in the ultrasonic ribbon bonding operation to a second side of the solar substrate.

16. The ultrasonic ribbon bonding system of claim 1 wherein a negative fluid pressure is provided through the plurality of through-holes to provide a downward pulling force on the workpiece between adjacent ones of the first plurality of standoffs.

17. The ultrasonic ribbon bonding system of claim 1 further comprising a pressing member proximate the ribbon bonding tool and carried by the bond head assembly, the pressing member configured for pressing against the ribbon adjacent an ultrasonically bonded portion of the ribbon, the pressing member being moveable with respect to the bond head assembly independent of the ribbon bonding tool.

18. The ultrasonic ribbon bonding system of claim 1 wherein the plurality of through-holes extend from the surface of the workholder to an opposing surface of the workholder, and wherein the plurality of through-holes are in communication with a negative fluid drawing source for drawing fluid through the plurality of through-holes.

19. The ultrasonic ribbon bonding system of claim 1 wherein the workholder includes a second plurality of through-holes, each of the second through-holes extending from an upper surface of ones of the first plurality of standoffs to an opposing surface of the workholder.

20. The ultrasonic ribbon bonding system of claim 19 wherein the opposing surface is internal to the workholder.

21. The ultrasonic ribbon bonding system of claim 19 wherein the plurality of through-holes and the second plurality of through holes are in communication with a negative fluid drawing source for drawing fluid through the plurality of through-holes.

22. The ultrasonic ribbon bonding system of claim 1 wherein the workholder defines a second plurality of standoffs extending above the surface of the workholder, each of the second plurality of standoffs having a second height above the surface of the workholder that is less than a first height of each of the first plurality of standoffs above the surface of the workholder, and wherein the plurality of through-holes extend from the surface of the workholder to an opposing surface of the workholder.

23. The ultrasonic ribbon bonding system of claim 22 wherein the plurality of through-holes are in communication with a negative fluid drawing mechanism for drawing fluid through the plurality of through-holes.

24. The ultrasonic ribbon bonding system of claim 1 further comprising: (a) an XY assembly; (b) a ribbon supply for providing the ribbon; (c) a ribbon guide carried by the XY assembly for guiding the ribbon from the ribbon supply to a position proximate the ribbon bonding tool, wherein the bond head assembly is carried by the XY assembly, and the bond head assembly is configured to travel along a substantially vertical axis, independent of the ribbon guide, such that the ribbon bonding tool is adapted to form an ultrasonic ribbon bond.

25. The ultrasonic ribbon bonding system of claim 1 wherein the workholder defines a second plurality of standoffs extending above the surface of the workholder, each of the second plurality of standoffs having a second height above the surface of the workholder that is less than a first height of each of the first plurality of standoffs above the surface of the workholder, and wherein the plurality of through-holes extend from an upper surface of one or more of the second plurality of standoffs to an opposing surface of the workholder.

26. The ultrasonic ribbon bonding system of claim 1 wherein the workholder defines a second plurality of standoffs extending above the surface of the workholder, each of the second plurality of standoffs having a second height above the surface of the workholder that is less than a first height of each of the first plurality of standoffs above the surface of the workholder, and wherein the plurality of through-holes extend from an upper surface of one or more of the second plurality of standoffs to an opposing surface of the workholder, and wherein the workholder defines a second plurality of through-holes extending from an upper surface of one or more of the first plurality of standoffs to the opposing surface of the workholder.

27. The ultrasonic ribbon bonding system of claim 1 wherein the workpiece includes a plurality of busbars on a first side of the workpiece, each of the first plurality of standoffs having a length greater than or equal to a length of a respective one of the plurality of busbars.

28. The ultrasonic ribbon bonding system of claim 1 wherein the workpiece includes a plurality of busbars on a first side of the workpiece, each of the first plurality of standoffs having a width less than or equal to a width of a respective one of the plurality of busbars.

29. The ultrasonic ribbon bonding system of claim 1 wherein the workpiece includes a plurality of busbars on a first side of the workpiece, each of the first plurality of standoffs having a width greater than a width of a respective one of the plurality of busbars.

30. The ultrasonic ribbon bonding system of claim 29 wherein each of the first plurality of standoffs defines a plurality of recesses configured to receive conductive regions of the workpiece during the ultrasonic ribbon bonding operation.

31. The ultrasonic ribbon bonding system of claim 30 wherein the workpiece is a solar substrate, and the conductive regions are on an active solar material of the solar substrate.

32. The ultrasonic ribbon bonding system of claim 1 wherein the workholder includes at least one insert secured to a body portion of the workholder, the at least one insert being configured to contact the workpiece during the ultrasonic ribbon bonding operation, a material of the at least one insert being different from a material of the body portion of the workholder.

33. The ultrasonic ribbon bonding system of claim 32 wherein the at least one insert is configured to contact a ribbon ultrasonically bonded to the workpiece.

34. The ultrasonic ribbon bonding system of claim 32 wherein the material of the at least one insert is ceramic.

35. The ultrasonic ribbon bonding system of claim 32 wherein an upper surface of the at least one insert is textured for gripping the workpiece during the ultrasonic ribbon bonding operation.

36. The ultrasonic ribbon bonding system of claim 35 wherein the upper surface of the at least one insert is textured for gripping a ribbon ultrasonically bonded to the workpiece.

37. The ultrasonic ribbon bonding system of claim 1 wherein each of the first plurality of standoffs has a continuous length that extends a length of the workholder.

38. The ultrasonic ribbon bonding system of claim 1 wherein each of the first plurality of standoffs includes a plurality of segments.

39. The ultrasonic ribbon bonding system of claim 38 wherein the workholder further defines a plurality of through-holes between adjacent ones of the plurality of segments.

40. The ultrasonic ribbon bonding system of claim 1 further comprising an initial ribbon ultrasonically bonded to a first surface of the workpiece, the initial ribbon being in contact with the workholder during ultrasonic bonding of the ribbon to a second surface of the workpiece during the ultrasonic ribbon bonding operation.

41. The ultrasonic ribbon bonding system of claim 1 further comprising an initial ribbon ultrasonically bonded to a first surface of the workpiece, the initial ribbon being in contact with the workholder during ultrasonic bonding of the ribbon to a second surface of the workpiece during the ultrasonic ribbon bonding operation, the ribbon being ultrasonically bonded to the second surface being ultrasonically bonded in a position substantially opposite the initial ribbon.

42. The ultrasonic ribbon bonding system of claim 1 further comprising an initial ribbon ultrasonically bonded to a first surface of the workpiece, the initial ribbon being in contact with the workholder during ultrasonic bonding of the ribbon to a second surface of the workpiece during the ultrasonic ribbon bonding operation, the ribbon being ultrasonically bonded to the second surface being ultrasonically bonded in a position offset from, and not directly opposite, a position of the initial ribbon.

43. A solar substrate ribbon bonding system comprising:
a workholder for supporting a solar substrate during a ribbon bonding operation, the workholder defining a first plurality of standoffs extending above a surface of the workholder, the first plurality of standoffs configured to contact the solar substrate during the ribbon bonding operation, the workholder defining a plurality of through-holes, wherein respective ones of the plurality of through-holes are positioned between ones of the first plurality of standoffs; and a bond head carrying a ribbon bonding tool, the ribbon bonding tool being configured to bond a ribbon to the solar substrate during the ribbon bonding operation.

44. An ultrasonic ribbon bonding system comprising:
(a) an XY assembly;
(b) a bond head assembly carried by the XY assembly;
(c) a ribbon bonding tool supported by the bond head assembly;
(d) a workholder for supporting a workpiece during an ultrasonic ribbon bonding operation, the workholder defining a first plurality of standoffs extending above a surface of the workholder, the first plurality of standoffs configured to contact the workpiece during the ultrasonic ribbon bonding operation, the workholder defining a plurality of through-holes, wherein respective ones of the plurality of through-holes are positioned between ones of the first plurality of standoffs; and
(e) a ribbon guide, carried by the XY assembly, for guiding a ribbon to a position proximate the ribbon bonding tool, the bond head assembly configured to travel along a substantially vertical axis, independent of the ribbon guide, such that the ribbon bonding tool is adapted to form a ribbon bond during the ultrasonic ribbon bonding operation.

45. The ultrasonic ribbon bonding system of claim 44 wherein the ultrasonic ribbon bonding system is a solar substrate ribbon bonding system configured to form the ribbon bond on a conductive region of a solar substrate.

46. The ultrasonic ribbon bonding system of claim 45 wherein the conductive region includes at least one busbar, a length of the ribbon being positioned over a length of the at least one busbar.

47. The ultrasonic ribbon bonding system of claim 44 further comprising a cutter carried by the bond head assembly and proximate the ribbon bonding tool.

48. The ultrasonic ribbon bonding system of claim 47 wherein the bond head assembly is configured to rotate in an XY plane about a theta ($\theta$) axis such that the cutter rotates about the theta ($\theta$) axis with the bond head assembly.

49. The ultrasonic ribbon bonding system of claim 44, further comprising a ribbon buffer for providing a slack length of ribbon between a ribbon supply of the ultrasonic ribbon bonding system and the ribbon guide.

50. An ultrasonic ribbon bonding system comprising:
(a) an XY assembly;
(b) a bond head assembly carried by the XY assembly;
(c) a ribbon bonding tool supported by the bond head assembly;
(d) a ribbon supply for providing ribbon;
(e) a ribbon guide, carried by the XY assembly, for guiding the ribbon from the ribbon supply to a position proximate the ribbon bonding tool; and
(f) a ribbon buffer for providing a slack length of ribbon between the ribbon supply and the ribbon guide,
the bond head assembly being configured to travel along a substantially vertical axis, independent of the ribbon guide, such that the ribbon bonding tool is adapted to form a ribbon bond,
and wherein the ribbon guide includes a tube extending between the ribbon buffer and the ribbon bonding tool.

51. The ultrasonic ribbon bonding system of claim 44 wherein the ribbon guide is configured to travel along a substantially vertical axis in relation to the XY assembly, independent of the bond head assembly.

52. A method of ultrasonically bonding a ribbon material to a workpiece, the method comprising the steps of:

(1) positioning a ribbon material over at least a portion of a conductive region of a workpiece during a ribbon bonding operation;
(2) supporting the workpiece with a workholder during the ribbon bonding operation, the workholder defining a first plurality of standoffs extending above a surface of the workholder, the first plurality of standoffs configured to contact and support the workpiece during the ribbon bonding operation, the workholder defining a plurality of through-holes, wherein respective ones of the plurality of through-holes are positioned between ones of the first plurality of standoffs; and
(3) ultrasonically bonding at least a portion of the ribbon material to the conductive region using a ribbon bonding tool carried by a bond head assembly during the ribbon bonding operation.

53. The method of claim 52 wherein the ribbon material is guided by a ribbon guide which guides the ribbon material from a ribbon supply to a position proximate the ribbon bonding tool, the ribbon guide and the bond head assembly being carried by an XY assembly, and the bond head assembly being configured to travel along a substantially vertical axis, independent of the ribbon guide, such that the ribbon bonding tool is adapted to form a ribbon bond in step (3).

54. A method of ultrasonically bonding a ribbon material to a substrate, the method comprising the steps of:
(1) providing a substrate with a conductive region;
(2) supporting the substrate with a workholder, the workholder defining a first plurality of standoffs extending above a surface of the workholder, the first plurality of standoffs configured to contact and support the substrate during step (4), the workholder defining a plurality of through-holes, wherein respective ones of the plurality of through-holes are positioned between ones of the first plurality of standoffs;
(3) feeding a ribbon material to a position at least partially overlying the conductive region, the ribbon material being guided during the feeding using a ribbon guide carried by an XY table; and
(4) ultrasonically bonding the ribbon material to the conductive region using a ribbon bonding tool carried by the XY table, the ribbon bonding tool being configured for substantially vertical movement along a vertical axis independent of the ribbon guide.

55. The method of claim 54 wherein step (3) includes feeding the ribbon material to the position at least partially overlying the conductive region where the substrate is a solar substrate and the conductive region includes a busbar.

* * * * *